United States Patent
Basol

(10) Patent No.: US 7,029,567 B2
(45) Date of Patent: Apr. 18, 2006

(54) ELECTROCHEMICAL EDGE AND BEVEL CLEANING PROCESS AND SYSTEM

(75) Inventor: Bulent M. Basol, Manhattan Beach, CA (US)

(73) Assignee: Asm Nutool, Inc., Fremont, CA (US)

( * ) Notice: Subject to any disclaimer, the term of this patent is extended or adjusted under 35 U.S.C. 154(b) by 282 days.

(21) Appl. No.: 10/327,609

(22) Filed: Dec. 20, 2002

(65) Prior Publication Data

US 2003/0141201 A1    Jul. 31, 2003

Related U.S. Application Data

(63) Continuation-in-part of application No. 10/032,318, filed on Dec. 21, 2001, now Pat. No. 6,833,063.

(60) Provisional application No. 60/424,936, filed on Nov. 8, 2002.

(51) Int. Cl.
*C25D 5/48* (2006.01)
*C25D 17/00* (2006.01)
*C25F 3/00* (2006.01)

(52) U.S. Cl. .............. 205/223; 205/651; 205/668; 204/224 M; 204/224 R

(58) Field of Classification Search .......... 205/87, 205/123, 133, 137, 157, 210, 223, 291, 668, 205/672, 674, 686, 651; 204/224 M, 224 R; 216/92, 105
See application file for complete search history.

(56) References Cited

U.S. PATENT DOCUMENTS

| | | | | | |
|---|---|---|---|---|---|
| 6,056,869 | A | * | 5/2000 | Uzoh | 205/771 |
| 6,309,981 | B1 | * | 10/2001 | Mayer et al. | 438/754 |
| 6,352,623 | B1 | * | 3/2002 | Volodarsky et al. | 204/275.1 |
| 6,610,190 | B1 | * | 8/2003 | Basol et al. | 205/133 |
| 6,615,854 | B1 | * | 9/2003 | Hongo et al. | 134/148 |
| 6,883,063 | B1 | * | 12/2004 | Basol | 205/668 |

* cited by examiner

*Primary Examiner*—Patrick Joseph Ryan
*Assistant Examiner*—Thomas H. Parsons
(74) *Attorney, Agent, or Firm*—Knobbe Martens Olson & Bear LLP

(57) ABSTRACT

An edge cleaning system and method is disclosed in which a directed stream of a mild etching solution is supplied to an edge area of a rotating workpiece, including the front surface edge and bevel, while a potential difference between the workpiece and the directed stream is maintained. In one aspect, the present invention provides an edge cleaning system that is disposed in the same processing chamber that is used for deposition or removal processing of the workpiece. In another aspect, the mild etching solution used for edge removal is also used to clean the front surface of the wafer, either simultaneously with or sequentially with the edge removal process.

36 Claims, 16 Drawing Sheets

ELECTROCHEMICAL EDGE AND BEVEL CLEANING PROCESS AND SYSTEM

RELATED APPLICATIONS

This is a continuation in part of U.S. Ser. No. 10/032,318 filed Dec. 21, 2001 (NT-239-US) and claims priority to U.S. Prov. No. 60/424,936 filed Nov. 8, 2002 U.S. Pat. No. 6,833,063 (NT-252-P) all incorporated herein by reference.

FIELD

The present invention generally relates to semiconductor processing technologies and, more particularly, to a system and process that removes a conductive layer from the edge and/or bevel of a workpiece and renders these areas free from unwanted impurities.

BACKGROUND

In the semiconductor industry, various processes can be used to deposit and remove conductive materials on the wafers. Deposition techniques include processes such as electrochemical deposition (ECD) and electrochemical mechanical deposition (ECMD). In both processes, a conductor such as copper is deposited on a semiconductor wafer or a workpiece from an electrolyte that comes into contact with the surface of the wafer and another electrode. Material removal techniques include chemical etching (CE), electrochemical etching (ECE), electrochemical mechanical etching (ECME) and chemical mechanical polishing (CMP), which are used to remove the unwanted excess portions of materials from the workpiece surface.

The term of Electrochemical Mechanical Processing (EC-MPR) is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECME processes are referred to as electrochemical mechanical processing (EC-MPR) since both involve electrochemical processes and mechanical action on the workpiece surface.

In one aspect of an ECMPR method, a workpiece-surface-influencing-device (WSID) such as a mask, pad or a sweeper is used during at least a portion of the electrotreatment process when there is physical contact or close proximity and relative motion between the workpiece surface and the WSID. Descriptions of various deposition and etching methods, including planar deposition and planar etching methods i.e. ECMPR approaches and apparatus, can be found in U.S. Pat. No. 6,176,952 entitled "Method and Apparatus For Electro Chemical Mechanical Deposition", and U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, both commonly owned by the assignee of the present invention.

Regardless of the deposition or removal process used, conventionally the workpiece is transferred to some type of cleaning and drying station after processing. During the cleaning steps, various residues generated by the processing are rinsed off the workpiece, and subsequently the workpiece is dried by spinning and if necessary blowing nitrogen on its surface.

In one design, the processing chamber, in which conventional plating or removal processing or ECMPR occurs, and the rinse chamber can be stacked vertically in a vertical process chambers arrangement. In this arrangement, the processing can be performed in a lower chamber, and the leaning and drying can be carried out in an upper chamber after isolating the upper chamber from the lower so that chemicals used in either chamber do not mix with each other. One such vertical chamber is disclosed in the co-pending U.S. application Ser. No. 09/466,014, now U.S. Pat. No. 6,352,623, entitled "Vertically Configured Chamber Used for Multiple Processes", filed Dec. 17, 1999, commonly owned by the assignee of the present invention.

Conventionally, a typical processing sequence is to initially perform deposition or plating of a conductive material onto a workpiece, and thereafter remove some of the previously deposited conductive material, such as the unwanted overburden conductive material from the front face of the workpiece.

Copper is a preferred conductive material used for integrated circuit (IC) interconnects and packaging applications. ECD and ECMD processes can deposit copper. Therefore it will be used as an example.

When copper is plated on a wafer front surface, in addition to areas where there are ICs, it may also deposit on the edges and sides, i.e., bevel, of the wafer where no ICs or circuits are located. In some cases, the edge and-bevel are protected from the plating solution; therefore no copper may be plated there. However, there may still be a copper seed layer on the edge regions and bevel. Whatever the source is, such remaining copper, i.e. the edge copper, may migrate to neighboring active regions from the sides and edges of the wafer, especially during an annealing step. Further, copper particles originating from a wafer edge may contaminate the wafer transport system, and other process equipment such as the annealing system etc., and so be passed on to contaminate other wafers. Poorly adhering copper flakes from the wafer edge may also cause problem during the CMP step by becoming loose and getting onto the surface areas where there are circuits. For these reasons and more, it is important to remove the copper from the edges and the bevel of the wafer following each copper plating process step.

U.S. Pat. No. 6,309,981 describes a method of removing metal from the edge bevel region of a semiconductor wafer. U.S. Provisional Application No. 60/276,103, an application assigned to the assignee of the present invention, describes a method and apparatus for removing edge copper in an upper rinsing chamber of a vertical chamber system that also includes a lower processing chamber.

In both of the above documents, the chemical removal approaches use aggressive etching solutions with oxidizers, such as sulfuric acid and hydrogen peroxide mixtures or strongly oxidizing acids such as nitric acid. Such aggressive etching solutions are designed so that the oxidizers chemically oxidize the copper and the oxidized copper dissolves in the acidic solution. To be able to obtain high process throughput the aggressive etching solutions are formulated to yield very high etching rates such as larger than 300–400 A/sec, preferably larger than 1000 A/sec, for copper. This corresponds to an etching rate of much higher than 20000 A/min. Although aggressive etching solutions and systems employing them are presently in use there are some issues associated with their utilization.

Strong oxidizers such as hydrogen peroxide are not very stable; therefore, mixing, transport and storage of the aggressive edge copper removal etchants present a challenge. For example, solutions containing hydrogen peroxide need to be shipped in breathable containers that do not allow pressure built-up in the container due to hydrogen peroxide break-up. These etching solutions also have a limited lifetime due to breakdown of the oxidizer. It is also challenging to attempt removal of material from the front face edge of the workpiece and maintain separation of the aggressive etching solution from front face portions other than the edge of the workpiece. As stated earlier, aggressive etching solutions are designed to etch copper at very high rates. Therefore any droplets inadvertently ending up on other portions of the wafer surface would etch these areas and cause oxidation and potential failure in IC's. Even the vapor of aggressive etching solutions causes oxidation and discoloration of the portions of the copper surface, especially adjacent to the edge where material removal is performed. Such oxidized regions need to be typically cleaned after the edge copper removal process, using a different acid solution with very low chemical etching rate. This makes it necessary to store and deliver yet another solution chemistry to the wafer surface and therefore adds to the cost. There is another consideration in using aggressive etching solutions specifically for vertical chamber structures such as shown in FIG. 5. In these systems the upper chamber and lower chamber are well isolated by flaps or other means of barriers. However, if there is any accidental leak and drops of the edge copper removal solution finds its way to the lower chamber, it can mix with the electroprocessing solution and cause problems.

U.S. Pat. No. 6,056,869 describes a device for deplating metal from side edges and a backside of a semiconductor wafer for chemical mechanical polishing that uses a specific electrochemical etching approach using a specific device design. In this patent, an etching solution is delivered to the whole backside of the wafer and it is used to electrochemically deplate metal from the edges and the back side while the upper side of the wafer is protected from the etchant by an inert fluid jacket.

Thus, there is a need in the semiconductor industry for systems and processes that allow for more efficient processing, including the removal of edge copper from a front face of the wafer, and removal of edge copper as part of other cleaning processes.

SUMMARY OF THE INVENTION

It is an object of the present invention to provide a method and apparatus for removing edge conductor that exists on a workpiece.

It is a further object of the present invention to provide a method and apparatus for removing an edge conductor using a directed stream of a mild etching solution applied to the edge of a workpiece.

It is a further object of the present invention to increase etching ability of a very low-etch-rate solution by passing a current through that solution and selectively delivering that solution upon an edge conductor of a wafer.

It is a further object of the present invention to provide a system that allows the same mild etching solution to remove an edge conductor and also clean the front surface of the workpiece.

It is a further object of the present invention to provide a system that allows the same mild etching solution to deposit the conductor on the front surface of the workpiece and also remove an edge conductor.

It is still a further object of the present invention to provide a system that allows for edge conductor removal, workpiece front surface cleaning, or both to be performed in the same processing chamber that is used for deposition or removal processing of the workpiece.

The above objects of the invention, among others, either singly or in combination, are achieved by the present invention by providing an edge cleaning system and method in which a directed stream of a mild etching solution is supplied to an edge area of a rotating workpiece, including the front surface edge and bevel, while a potential difference between the workpiece and the directed stream is maintained.

In one aspect, the present invention provides an edge cleaning system that is disposed in the same processing chamber that is used for deposition or removal processing of the workpiece.

In another aspect, the mild etching solution used for edge removal is also used to clean the front surface of the wafer, either simultaneously with or sequentially with the edge removal process.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION

Figure 1:
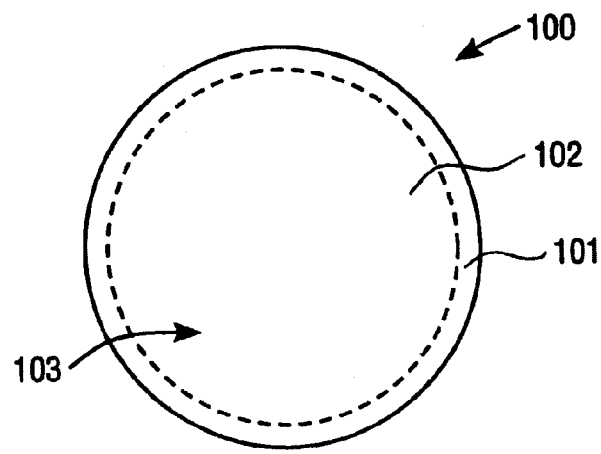
FIG. 1 illustrates a wafer on which edge removal is performed according to the present invention.

The present invention provides a solution to the concerns cited above. The approach of the present invention, as described hereinafter, advantageously reduces edge copper removal time and thus increases throughput without the associated problems of using even more aggressive etching solutions. The technique has the capability to use mild etching solutions without oxidizers and thus has no etchant stability problem. Conductors on the front face edges of the workpiece can be removed without the concern that other front face portions of the workpiece will be etched or otherwise affected by droplets of the etchant, because the mild etching solutions have very low chemical etching rates of less than 100 A/sec, preferably less, than 50 A/sec for copper which is the example conductor. These rates correspond to an etching rate range of less than about 3000 A/min as opposed to the etching rate of much higher than about 20000 A/min for aggressive etching solutions. This is because the mild etching solutions employed in the present invention are not strong oxidizers or they do not contain an appreciable amount of strong oxidizers. An exemplary mild etching solution is a 5–10% (by weight) sulfuric acid solution in water. As will be described hereinafter, even a typical copper plating solution may be employed as a mild etching solution of the present invention. An aggressive etchant formulation with reduced amount of oxidizer may also be used in the present invention. The typical composition of an exemplary aggressive etching solution contains 3–10% (by weight) hydrogen peroxide. Chemical etching rate of this solution may be reduced by employing hydrogen peroxide concentrations of less than about 1%. What is preferable in this invention is the use of an etching solution with a chemical etching rate (without applied voltage) of less than 50 A/sec.

The etching rate of the mild etching solutions of the present invention increases only when a voltage is applied to the copper to oxidize it. Once the copper surface is oxidized by the electrochemical process, it can be removed by the mild etching solution. The etching rate of the mild etching solutions may be higher than 500 A/sec, preferably higher than 1000 A/sec in presence of an applied voltage. Etching current densities for such etching rates may be higher than 100 mA/cm2. Solutions that are compatible with the plating electrolyte may be used as the mild etching solutions so that possible accidental leaks of the edge copper removal solution into the plating electrolyte would not be an important concern for vertical chamber process modules. For example, use of a 5–15% by weight sulfuric acid solution is very attractive since this solution would be chemically compatible with the commonly used copper plating electrolytes containing sulfuric acid and copper sulfate.

It should be noted that the present invention can be used in any edge copper removal system or chamber. The vertical chamber structure and use of ECMD are given here only by way of example. The mild etching solutions do not cause oxidation of the copper surface adjacent to the edge area where edge copper removal process is carried out. Therefore an acid wash step may be completely eliminated. Even if such a step is utilized, this process step could use the same mild etching solution that is used during the step of edge copper removal, only without the applied voltage. This means further savings since it eliminates storage and delivery of a second solution to the wafer surface. In cases where the edge copper removal step is performed in a system that is integrated with the copper plating process, it is possible to use the plating electrolyte as the edge copper removal solution. This reduces costs even further.

When mild etching solutions are used in the process of the present invention droplets of the etching solution may inadvertently land on areas of the wafer other than the edge areas where copper removal is intended. This would not pose a problem in this case since the droplets would not be in physical contact with the electrode through which a cathodic voltage is applied to the solution. Without an etching current passing through the etching solution and the copper, the only etching the droplets can do is chemical etching that, as discussed, is minimal.

Figure 2:
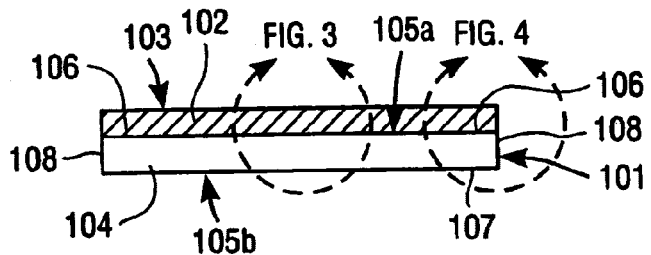
FIG. 2 illustrates a cross section of a wafer on which edge removal is performed according to the present invention.

FIG. 1 is a top plane view of a plated workpiece 100 such as a semiconductor wafer. As also shown in FIG. 2 in side view, the plated wafer 100 comprises a top layer 102 having a top surface 103 and a bottom layer 104 having an upper surface 105a and a bottom surface 105b. The top layer 102 is formed on the upper surface 105a of the bottom layer 104. A top surface edge portion 106 of the upper surface 105a of the bottom layer 104, a side surface 108 of the bottom layer and a bottom surface edge portion 107 of the bottom layer define an edge region 101 around the perimeter of the bottom layer 104. In this embodiment, the top layer 102 of the plated wafer 100 is comprised of a layer or layers of conductive material, for example copper, and the bottom layer 104 comprises a semiconductor substrate, such as a silicon substrate which may have devices, circuits and interconnect structures already fabricated into it.

Figure 3:
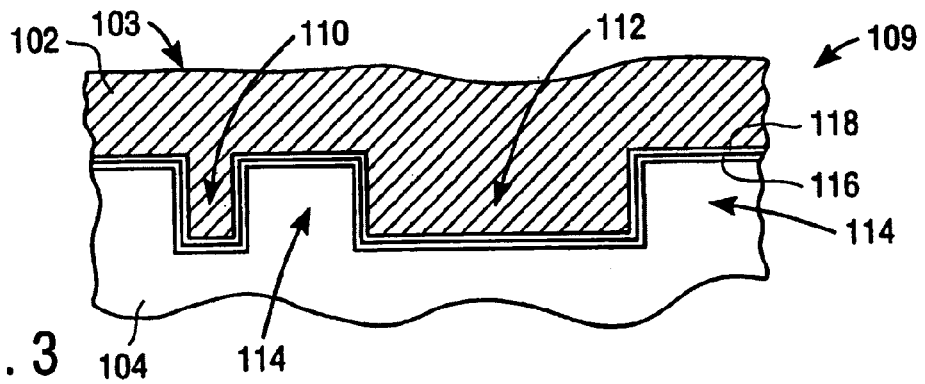
FIG. 3 illustrates a more detailed cross section of a surface portion of a wafer on which edge removal is performed according to the present invention.

FIG. 3 is an enlarged partial cross-sectional view of near top surface region 109 of the wafer 100, shown in FIG. 2, which comprises a via and a trench feature 110 and 112 formed in an insulating region 114 which is previously formed on the wafer surface. As shown in FIG. 3, the surface region 109 of the plated wafer 100 may comprise a plurality of via, trench and other features such as dual damascene features. The features 110, 112 and the surface of the insulator between the features are typically lined with a diffusion barrier/glue layer 116 and a seed layer 118, i.e., copper seed layer for the case of copper deposition. In most cases, the barrier layer 116 and/or the seed layer 118 extends onto the top surface edge portion 106, and sometimes onto the wafer side 108. In fact, one or both of these layers may wrap around and coat the bottom surface edge portion 107, thereby covering the edge region 101. Since, during the electroplating, copper only deposits on the conductive regions that are coated with barrier or copper seed layer or with a barrier/seed composite layer, this, in turn, may cause copper to deposit on the edge region 101, if the edge region 101 is exposed to the plating electrolyte. Electroplated copper layer 102 fills the vias 110 and the trenches 112 and forms the copper layer 102 on the substrate 104.

Figure 4:
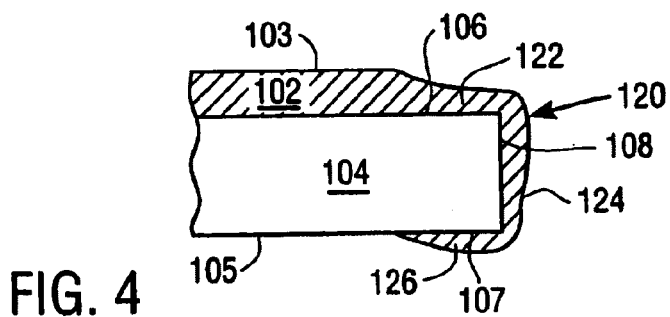
FIG. 4 illustrates a more detailed cross section of an edge portion of a wafer on which edge removal is performed according to the present invention.

As mentioned above, the copper layer 102 may also extend onto the edge region 101 and thus forming an edge copper 120 shown in FIG. 4. It should be noted that barrier/glue layer is not shown in FIG. 4 and that the edge copper 120 may be as a result of having copper seed layer on the edge region 101, and plating this region with copper when the edge region 101 is exposed to the plating electrolyte during plating. Alternatively the edge copper 120 maybe just the seed layer itself covering the edge region 101, if the edge region is protected from the plating electrolyte during the plating process using well known sealing means. The edge copper 120 may form around the whole or partial circumference of the wafer 100. As exemplified in FIG. 4, the edge copper 120 may have an upper portion 122, a side portion 124 and a lower portion 126, which are formed on the edge region 101. The edge copper portions 122–126 can be removed from the edge region 101 by applying a copper etching solution through the process of the present invention. Although, in this embodiment, the edge copper 120 is exemplified using the upper, side and lower portions, it is understood that this is for the purpose of exemplifying the problem; consequently, the unwanted copper may just have the upper portion or just the upper and side portions etc.

It should be noted that even in the case where copper may not be deposited on the top surface edge portion 106, the side surface 108 and the bottom surface edge portion 105 of FIG. 4 during the plating step, presence of the copper seed layer in those areas may exist and is typically undesirable. And, a conventional CMP step, which is carried out after the plating step, may be able to remove any copper on the top surface edge portion 106, but would not be effective in removing copper from the side surface 108 and the bottom surface edge portion 107.

Figure 5:
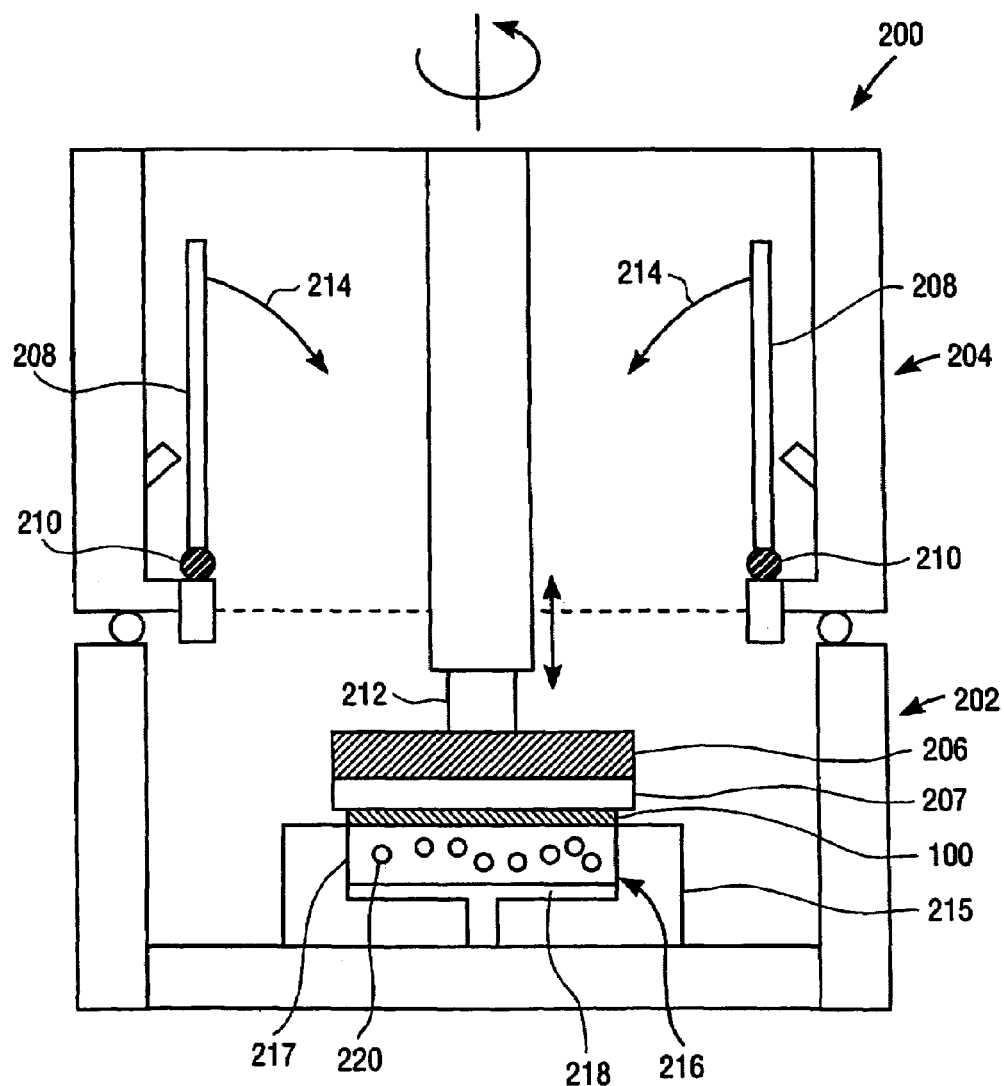
FIG. 5 illustrates a vertical chamber in which edge removal is performed according to the present invention.

The copper layer 102 may be deposited on the substrate 104 using an electroplating process and system 200 shown in FIG. 5. The system 200 may be a vertical chamber system comprising a lower section 202 shown in FIG. 5. One such vertical chamber system is disclosed in the co-pending U.S. application Ser. No. 09/466,014, now U.S. Pat. No. 6.352.623, entitled "Vertically Configured Chamber Used for Multiple Processes", filed Dec. 17, 1999, commonly owned by the assignee of the present invention. Although the present invention is described using a vertical chamber system, it is for the purpose of exemplifying the present invention. Embodiments of the present invention can be used with other systems, such as systems having cleaning and process chambers that are not adjacent, as well as in chambers that perform other processes as described further herein. Accordingly, according to this embodiment, an edge copper removal process is performed within the upper chamber. Thus, while the lower chamber will comprise some type of processing section, such as an ECMPR, plating or material removal system, the upper section will contain a cleaning and edge copper removal and drying section. The upper and lower sections have a movable barrier, described in one specific embodiment as guard flaps, which keep the various materials and solutions used in the processes of the upper chamber from reaching the lower chamber, as described further herein.

In one embodiment of the process, a process is initially performed on the front surface of the workpiece in the lower section 202, and in the following stage, a cleaning by rinsing may be performed in the upper section 204. As will be described more fully below, sequentially before or after, or simultaneously with the cleaning, in the upper section 204, an edge copper removal process is performed. As will be also described below in an alternative embodiment, the edge copper removal process can also be performed in the lower section when the lower section is such equipped. The edge copper removal process can, if desired, be followed by a second cleaning and drying process. Alternately, the initial cleaning step may be skipped to increase throughput. In this case cleaning and drying is done once the edge copper removal process is complete.

As shown in FIG. 5, a wafer holder 206 supports the wafer 100 as deposition process is performed in the lower section 202. The wafer holder may comprise, preferably, circular chuck 207 upon which the wafer 100 is loaded, bottom surface 105 first (see FIG. 2), and secured. Guard flaps 208 via linkage shafts/rollers 210 are positioned vertically such that the wafer holder 206 using a shaft 212 can be lowered into the lower section 202. The shaft 212 is further adapted to move side to side and to rotate about the vertical axis of the shaft 212. During the cleaning, edge copper removal and drying, the wafer holder 206 is raised vertically into the upper section 204 and the flaps 208 are closed by moving them in the direction of the arrows 214.

During an ECMPR, as mentioned above, the wafer 100 is operated upon (see also FIG. 3). For example, an ECMD process can be used to form a generally flat copper layer over the features. An ECMPR apparatus 215 may comprise a wafer surface influencing device (WSID) assembly 216 having a WSID 217 such as a pad having asperities 220, and an electrode 218 immersed in a solution, which can be an electrolyte solution if either ECMD or ECME is used, an etching solution if only ECME is performed, and other solutions if other depositing or removal methods are used.

An electrolyte solution used in an ECMD process will contain ions of a metal being deposited, such as copper, and touches a plating electrode (not shown) and the wafer 100 by flowing through the WSID 217. An exemplary copper plating solution may be a copper sulfate, sulfuric acid solution which is commonly used in the industry and which may also contain additives such as accelerators, suppressors, chloride and in some cases levelers. During electroprocessing, the top surface 103 of the wafer 100 is brought into close proximity, which can be slightly spaced from or preferably in contact with, the WSID 217 while a potential difference applied between the plating electrode and the wafer surface.

Figure 6:
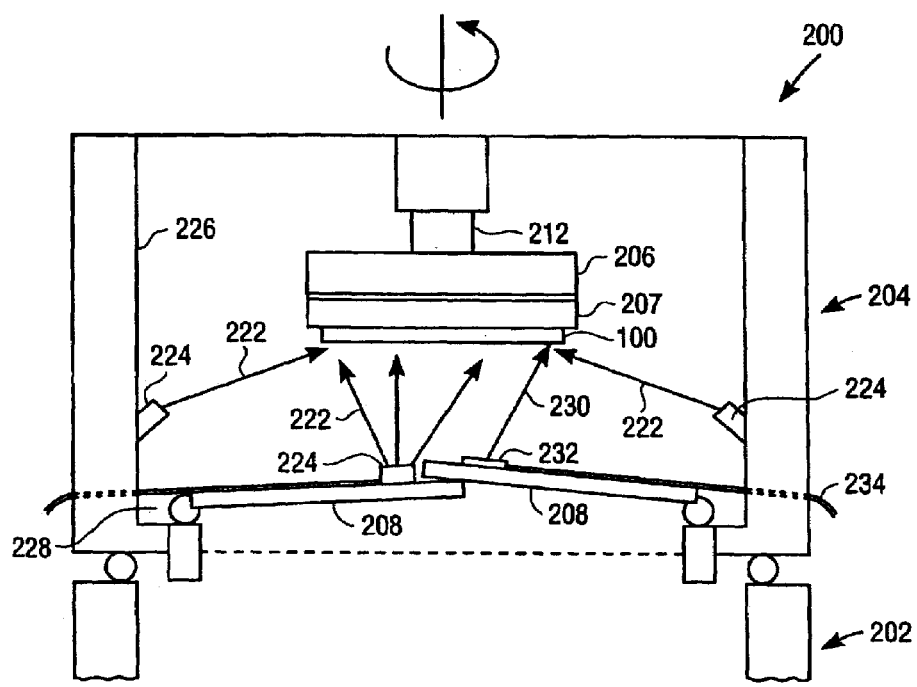
FIGS. 6 and 7 illustrate the edge removal apparatus of the present invention in further detail.
Figure 7:
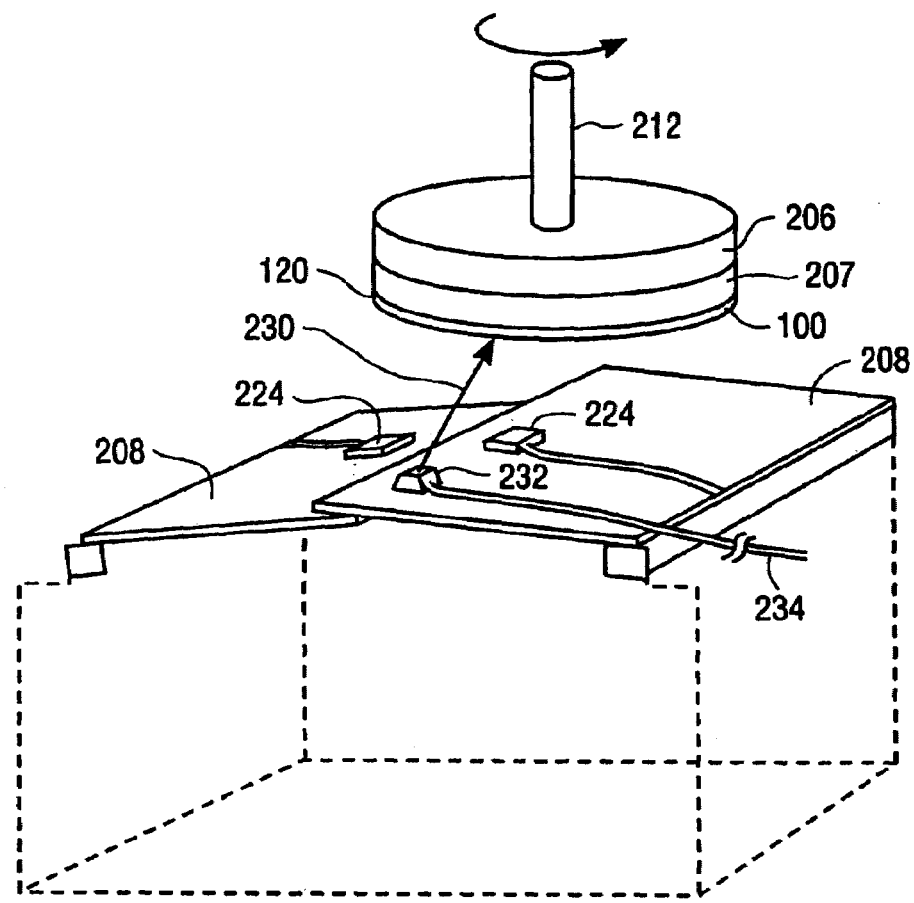

As shown in FIGS. 6 and 7, after the processing takes place in the lower section 202 of the system 200, the wafer holder 206 is raised using the shaft 212. Then, the flaps 208 are moved from their vertical position to their horizontal position to separate the lower section 202 from the upper section 204. Once the flaps 208 are in closed position the cleaning is carried out. During the cleaning by rinsing, the holder 206 may be lowered towards the flaps 208.

In one embodiment, a stream of a cleaning solution, depicted by the arrows 222, may be provided through nozzles 224 that are located on the side walls 226 of the upper section and/or on the flaps 208. Used cleaning solution is drained out of the section 204 using outlet channels 228 along the side walls 226 as schematically shown in FIG. 6. This solution does not mix with the electrolyte in the lower section 202 due to the presence of the flaps 208 in the closed position. During the cleaning step, the wafer 100 is rotated and the cleaning solution is applied to the wafer 100. The wafer 100 may be spin-dried by rotating the wafer at high rpm. Additionally, clean and dry air or inert gas like nitrogen may also be blown on the wafer to help dry it.

After the cleaning and drying processes, edge copper removal process is performed in the same upper chamber 204, using a stream of a mild etchant, as will be described hereinafter. Alternately, after the workpiece processing is completed in the lower chamber 202, the wafer is moved up by the shaft 212 so that wafer surface does not touch the solution in the lower chamber. However wafer still remains in the lower chamber 202. A high rpm spin of wafer (typically 200–1000 rpm) removes the excess solution, such as an electrolyte, from the surface of the wafer and dries the surface. The wafer is then raised to the upper chamber 204 for edge copper removal process. Cleaning and drying steps are performed after edge copper removal.

Yet another alternate processing sequence involves rinsing the wafer surface in the upper chamber 204 after the plating step. Edge copper removal is then performed without the spin-dry step. Edge copper removal is then followed by rinsing and drying steps. These alternate process sequences aim at reducing process times and increasing throughput.

Figure 9:
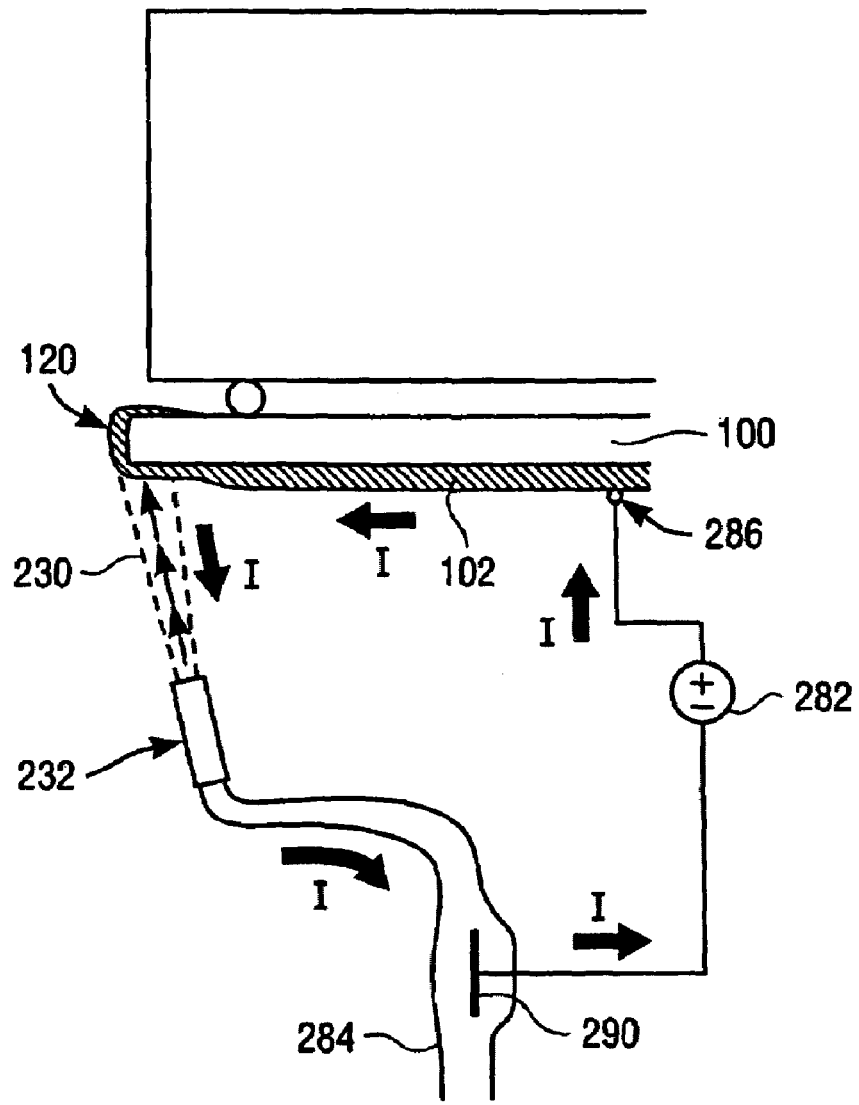
FIG. 9 illustrates in further detail edge removal according to the embodiment of the invention illustrated in FIGS. 6 and 7.

Referring to FIGS. 6 and 7, during the edge copper removal, a stream of mild etching solution, depicted by the arrow 230, is applied on the edge copper 120 while the wafer 100 is rotated at approximately 20 to 1000 rpm, preferably at 50 to 500 rpm. Further, as shown in FIG. 9 in more detail a potential difference, shown as (+) and (−), is created between the stream and the workpiece, which allows for the mild etching solution to perform metal removal at the edge and bevel regions of the workpiece in an amount of time that is much less than that which could occur without the use of the applied potential difference. The potential is applied between the wafer surface containing copper film and an etching electrode that is in physical contact with the mild etching solution. Electrical contact may be made to the wafer surface through various means including through a stationary contact that slides on the wafer surface as the wafer is rotated. The etching electrode may be made of any conductive material that is stable in the mild etching solution that it touches. Platinum coated metals and titanium are etching electrode materials.

As pointed out previously, by mild etching solution is meant a solution, which, without application of the potential difference, only provides minimal etching. The etching rate of such mild etching solutions may be less than 100 A/sec, preferably less than 50 A/sec. Therefore, these solutions are not useful for standard edge copper etching applications. To remove an edge copper layer of, for example, 2000 A using such a mild etching solution, a process time of more than 40 seconds would be needed. To remove a thicker layer of, for example, 1 micron, the processing time would be prohibitively long. Alternately, when such a solution is used as in the present invention in the presence of an applied voltage, much shorter processing times can be achieved since etching rates may be higher than 1000 A/sec, depending upon the voltage applied, temperature of the solution and the exact chemical composition of the solution. If during processing some mild etching solution spills on the wafer surface away from the edge, it would etch only a small amount of material based on the zero-voltage (chemical) etching rate. Referring to FIG. 7, the mild etching solution is applied in the form of a regulated stream through at least one nozzle 232 that is preferably mounted on the flaps 208 or otherwise located relative to the wafer 100 such that the nozzle 232 directs a stream of the mild etching solution toward the wafer 100 in a manner that the stream has a horizontal component that is directed away from the center of the wafer 100, thus assisting with keeping the solution away from the central portion of the wafer, but on the edge copper 120.

The mild etching solution can be fed to the nozzle 232 through a feed tube 234 that is connected to a feed pump (not shown). The nozzle 232 directs the solution to the edge or perimeter of the wafer as a tightly controlled stream. The etching solution can be applied in various amounts for various periods of time, preferably in a range of 1 to 10 ml per second for approximately 5 to 10 seconds. Owing to both centrifugal force generated by the spinning wafer and the surface tension of the solution, the solution arrives at the edge of the wafer at an angle and the stream of solution that is outwardly directed to the upper portion 122 of the edge copper 120 flows over the portions 124 and 126 of the edge copper 120 and covers them (see FIG. 4). The angle at which the mild etching solution strikes the edge copper 120 can also be varied, which allows for narrowing or broadening of the etched region, which is the edge region 106. The width of the edge region 106 can also be changed by moving the wafer and/or the nozzle laterally or vertically. If the nozzle is constantly kept at a given angle, the etched region may be narrowed or broadened by moving the wafer up and down or moving it laterally. Similarly if the wafer is kept in the same lateral position and same elevation (but rotated), the etched region can be broadened or narrowed by varying the angle of the nozzle with respect to the wafer. As long as the above given process works in the manner described, the nozzle may be positioned on the walls or other places, and within the scope of the invention. As will be exemplified below, in an alternative embodiment, the same electrochemical removal process can be carried out in the lower chamber 202, shown in FIG. 5, when the lower chamber 202 is such equipped.

Figure 8:
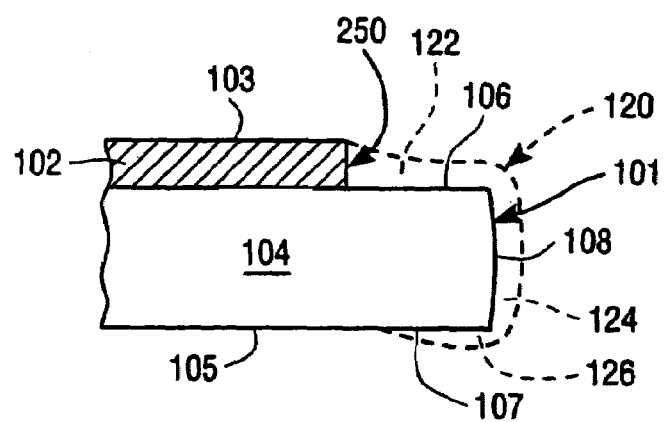
FIG. 8 illustrates an edge portion of a wafer that has had copper removed therefrom according to the present invention.

As shown in FIG. 8, accordingly, the mild etching solution under the applied potential difference etches and removes the edge copper portions 122–126 from the top surface edge portion 106, side surface 108 and the edge portion 107, thereby revealing the edge region 101. Referring to FIG. 8, the removal process of the present invention leaves a copper end wall 250 adjacent the edge region 101. After the etching process, the wafer is cleaned and dried.

Thus, in accordance with the principles of the present invention, the edge copper is electrochemically removed using a mild etching solution. In comparison to the chemical removal or etching processes, electrochemical removal of the edge copper may be faster. Another advantage of the electrochemical edge copper removal is that the process can use mild etching solutions, the standard edge copper removal solutions, as well as diluted versions of the standard edge copper removal solutions which contain oxidizers. The preferred method is to use mild etching solutions.

A unique feature of the present invention is its ability to use a plating solution as the mild etching solution for edge copper removal. For this purpose, any kind of plating solution can be used. In this embodiment, an exemplary mild etching solution used for edge copper removal may be a copper plating solution comprising 10–200 gm/l sulfuric acid and 15–50 gm/l Cu. This solution may also contain at least one of the commonly used plating additives including chloride, accelerators, suppressors and levelers. If the edge copper removal is performed in the upper chamber of the system of FIG. 5, an accidental leakage of this solution into the plating solution used in the lower chamber will not affect the quality of the plating solution since they are both the same solution.

FIG. 9 shows in more detail the edge removal system and process. The numbering of various components is the same as in FIGS. 6 and 7. The mild etching solution 230 contacts the edge copper 120. At least one contact element 286 is connected to a positive terminal of a power supply 282, and it may touch anywhere on the copper layer 102. Contact elements 286 may be made of conductive brushes or wires. The negative terminal of the power source 282 is connected to an etching electrode 290, which is in physical contact with the mild etching solution. During the process, upon application of voltage from the power source 282, a current is passed through the circuit indicated by bold arrows I. It should be noted that the mild etching solution 284 flows in the form of a well regulated stream as indicated by arrows and it acts as a conductor in this circuit through which the etching current passes. Therefore, it is very important that the stream be continuous. Otherwise etching would not take place at the increased rate. The nozzle 232 can be an electrically conductive nozzle, receiving the solution 230 through a solution conduit 284. In this case the nozzle may be the etching electrode and the negative terminal of the power source 282 may be directly connected to the body of the nozzle. Alternatively, as shown in FIG. 9 the nozzle 232 can be made of insulating materials. In this case, an etching electrode 290 touching the solution 230 may be connected to the negative terminal of the power supply 282. In either way, due to the negative voltage on the etching electrode, a copper accumulation may occur on the surface of the etching electrode after multiple edge copper removal procedures. Therefore, they may have to be periodically cleaned to remove copper deposits accumulating on them. This cleaning may be chemical or electrochemical in nature. The nozzle 232 can be for example located on the flaps or on the chamber side walls. The power supply may be a power supply used for electrodeposition in the vertical chamber system or a power supply solely used for the edge copper removal process. However, if a power supply of the vertical chamber system is used, the power supply can be available in a shared manner for both processes such that the power supply can be used for the edge copper removal process when it is not used for the plating.

During the electrochemical edge copper removal, the mild etching solution 230, depicted by the arrows in FIG. 9, is applied on the edge copper of the wafer 100 while the wafer 100 is rotated at approximately 20 to 1000 rpm, preferably at 50 to 500 rpm. The mild etching solution is applied in the form of a well-regulated and continuous stream through the nozzle 232. Preferably, the stream of the mild etching solution may have a diameter of 0.5 mm to 2 mm, preferably 1 mm. Once the power is applied to the contact elements and the etching electrode or nozzle, edge copper 120 is electrochemically removed. As previously mentioned, during the removal due to both the surface tension of the removal solution and the rpm of the wafer, the solution wraps around the edge copper and etches the edge copper uniformly, rendering the edge region 101 of the wafer 100 shown in FIG. 8. At this point, the rpm of the wafer should be optimized to render the edge profile shown in FIG. 8. If the rpm of the wafer is too high, the solution will not wrap around the edge and as a result the edge removal will not be successful. On the other hand, if the rpm is too low, the solution will extend more towards the center of the wafer and potentially result in thinning of the copper layer adjacent edge region 101, which is an unwanted situation.

As indicated before, use of mild etching solutions and electrochemical nature of the process provide several advantages against the prior edge copper removal processes. Adding to the benefits described above, as opposed to the prior art aggressive etching solutions, during an accidental splash of the mild etching solution over the copper layer, the damage inflicted by the mild solution is very insignificant.

As is understood, the discontinuity in the electrical component of the electrochemical process, during the splash, simply takes away the mild solution's enhanced etching ability. Another advantage of the process is that the removal process can be carried out in either a voltage controlled manner or a current controlled manner. Both techniques allow an operator to monitor the removal process and stop it when the end point is detected, that is, when the edge copper is removed. For example, if the voltage control is selected, a sharp decline in the current used by the removal process may reveal the edge copper removal endpoint and the process is halted at this point. Alternatively, if the current control is selected, a sharp increase in the voltage used by the process indicates the edge copper removal endpoint.

In this embodiment, in order to provide better solution wrap-around, the nozzle may be positioned above the level of wafer 100 and slightly angled towards the edge copper 120.

Figure 10A:
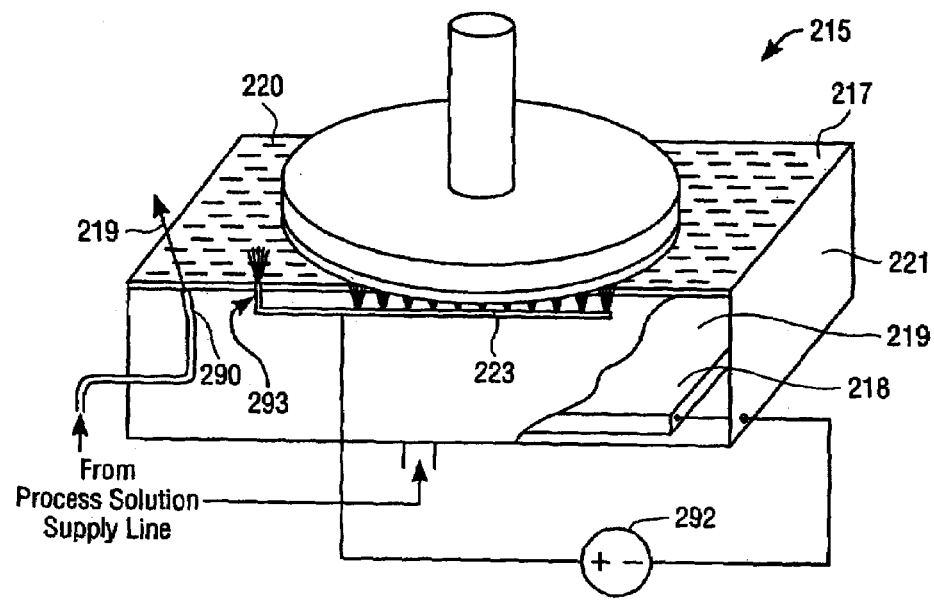
FIGS. 10A and 10B illustrate an apparatus that can be used for both ECMPR and edge removal processes according to the present invention.
Figure 10B:
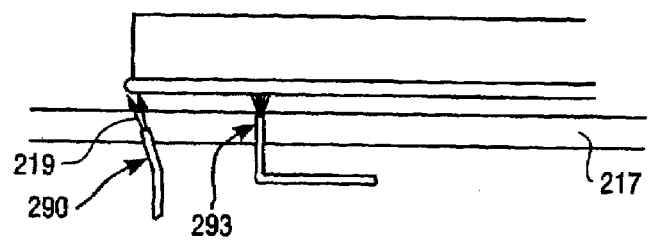

Because the solution used for edge bevel removal is a mild solution in certain circumstances the edge bevel removal can occur in the same processing chamber that operates to deposit or remove material from the front face of the workpiece. FIGS. 10A–10B show an alternative embodiment that performs the electrochemical edge copper removal in the lower section 202 of the system 200 shown in FIG. 5. As mentioned before, the ECMPR apparatus 215 comprises the WSID 217 having asperities 220, the electrode 218 immersed in a process solution 219. The process solution 219 is held in a cavity 221 on which the WSID is placed. As mentioned above, during an ECMPR, surface of the wafer is wetted by the process solution flowing through the WSID 217 while an electrical potential is established between the surface of the wafer 100, which is being processed and which is in proximity of the WSID 217, and the electrode 218. In this embodiment, the process solution 219 is a process solution that can be used both for example a plating process and a subsequent electrochemical edge copper removal process, although it is understood that an etching process instead of a deposition process could also be performed. For both processes the process solution 219 is delivered from a process solution supply tank (not shown). During the process, electrical contact to the wafer surface can be established through contacts 223 placed adjacent the WSID 217. The contacts moveably contact the exposed edge of the wafer while the wafer moves over the WSID. The contacts 223 are typically conductive brushes such as described in, for example, U.S. Provisional Application entitled "Method and System to Provide Electrical Contacts for Electrotreating Processes", filed on Sep. 12, 2001.

As illustrated in FIG. 10A, in this embodiment, the ECMPR apparatus 215 is equipped with an electrochemical edge copper removal device 290 that may be a nozzle. The nozzle is connected to the same process solution supply tank that is mentioned above thereby in electrical contact with the electrode 218. This electrical connection with the electrode 218 of the system 200 eliminates the need for a conductive nozzle or a nozzle containing a special etching electrode when performing the electrochemical edge removal process, both requiring connection to a negative terminal of a power supply 292 of the system 200. Instead the electrode 218 which is used for plating (or removal) is also used as the etching electrode for edge copper removal process. Of course, using such conductive nozzles or nozzles having special etching electrodes are within the scope of the present invention.

During the electrochemical edge copper removal process, required positive electrical contact to the wafer surface may be established using a contact element that is already electrically connected to the contacts 223 of the ECMPR apparatus 215. In this case, the level of the process solution 219 within cavity 221 is lowered so that an electrical path through the solution 219 to the front face of the wafer 100 through the solution 219 within the cavity 221 does not exist, thereby ensuring that the only conductive path through the solution 219 to the wafer 100 that exists is the path through edge copper removal device 290. Alternately contact 293 may be isolated and its electrical connection to the power supply 292 may be achieved through a switch (not shown). With the alternate configuration, referring back to FIGS. 10A and 10B, the contact element 293 may be a conductive brush located in the vicinity of the nozzle 290. Both the brush 293 and the nozzle 290 may be placed in an appropriate location around the WSID so that they do not have any physical contact with the wafer during the period when plating (or removal) is occurring. The brush 293 may have longer strands than the strands of the contacts. Such longer strands can establish contact with the surface of the wafer when the wafer is elevated above the WSID and moved over the area where the nozzle and the brush 293 are located, for the edge copper removal process. During this edge copper removal process, the only electrical path that exists from the solution 219 to the wafer 100 is through the edge copper removal device 290.

As shown in FIG. 10B, as the wafer, which is copper plated during the previous ECMPR process, is moved in the proximity of the edge copper removal device 290, the brush 293 touches the surface. The mild etching solution 219 is applied upon the edge copper as in the manner described above. After the copper deposition (or removal) process it is best to move the wafer away from the WSID and the plating solution and spin it to drive the excess solution from its surface. Then wafer is moved to the new position to carry out the edge copper removal step. Using the plating solution as the edge copper removal solution is very attractive because it eliminates the need to store and deliver multiple solutions for multiple purposes (plating or edge copper removal).

Figure 11:
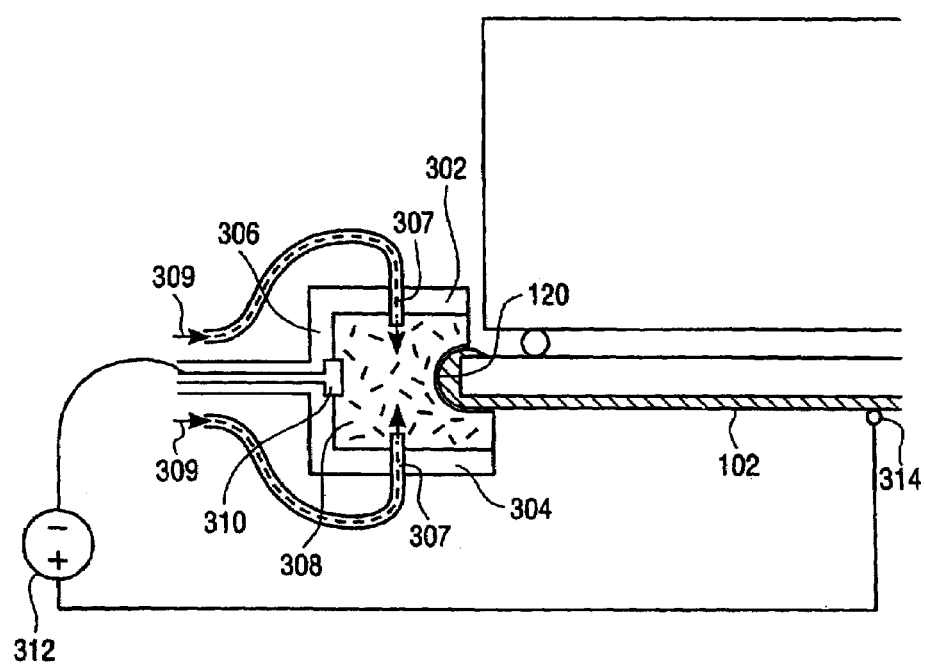
FIG. 11 illustrates in further detail edge removal according to another embodiment of the invention.

As shown in FIG. 11, in another embodiment, an edge copper removal process 300 may comprise a rectangular 'U' shaped body having an upper arm portion 302 and a lower arm portion 304 connected to one another with a base portion 306. Solution inlet ports 307 are connected to the upper and lower arms to deliver a mild etching solution to a solution holding member 308 placed into the U-shaped body. The base portion 306 of the apparatus 300 contains an electrode 310, which is connected to a negative terminal of a power source 312. The holding member 308 is preferably a soft spongy material, which can be saturated with the mild solution delivered through the ports. When the holding member is pressed against the edge copper 120, it wraps around the edge copper and conveys the mild solution to the edge copper 120. At least one contact element 314, which is connected to a positive terminal of a power supply 310, may touch anywhere on the copper layer 102. The mild etching solution is applied on the edge copper 120 while the wafer 100 is rotated. As a result edge copper is etched from the edge of the wafer.

Figure 12:
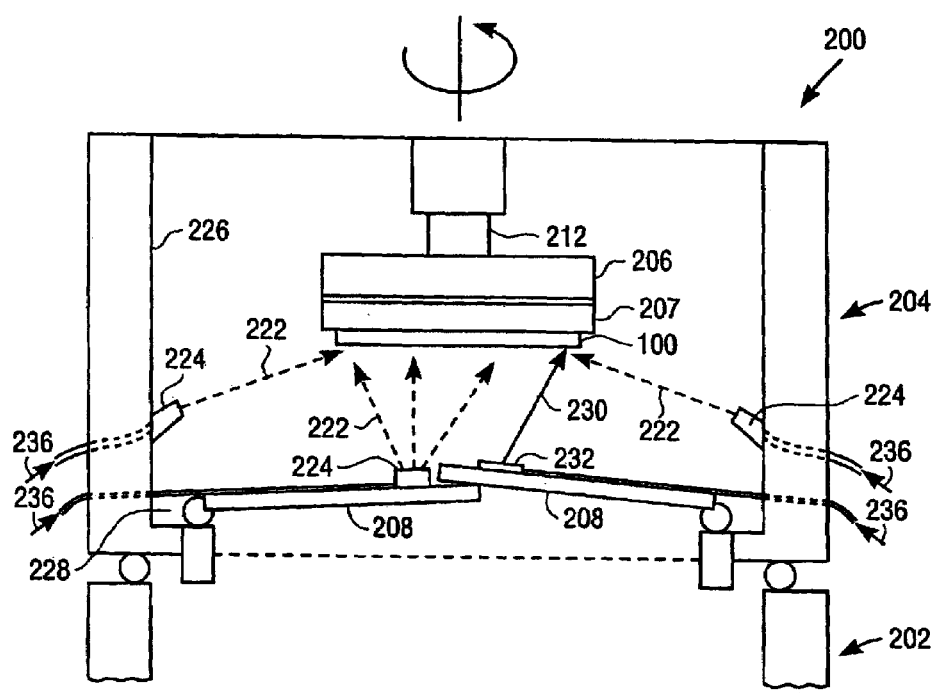
FIG. 12 illustrate an apparatus that can be used for both workpiece cleaning and edge removal processes according to the present invention.

FIG. 12 illustrates another embodiment, in which the same solution is used for both edge bevel removal and for cleaning the front face of the wafer. FIG. 12 is illustrated for purposes of this description as being a modification of FIG. 6, described previously. It is noted, however, that the system described herein need not be used in an upper chamber of a vertical chamber processing system, although there are advantages to using it in such location, and as a result it is so described. Since the same solution is suited for edge bevel removal, that solution is used to feed both of the nozzles 232, as well as nozzles 224 from a single supply source, indicated by the arrow 236. While the same supply source is used, there may be different pumps for different nozzles, or a single pump and different types of nozzles, such as nozzles 232 that provide a continuous stream and nozzles 224 that provide a mist. As illustrated, however, while there is a stream of solution that is emitted from nozzle 232 in order to perform edge bevel removal as described above, the solution that is emitted from nozzle 224 is emitted as a spray, with droplets, but avoiding a stream. By using a stream of the solution for edge bevel removal, including the front face edge, but only droplets on the remaining front face of the workpiece, etching will occur much more rapidly on the edge bevel region due to the electrical path that the stream maintains, which electrical path cannot be maintained by the droplets.

Figure 13A:
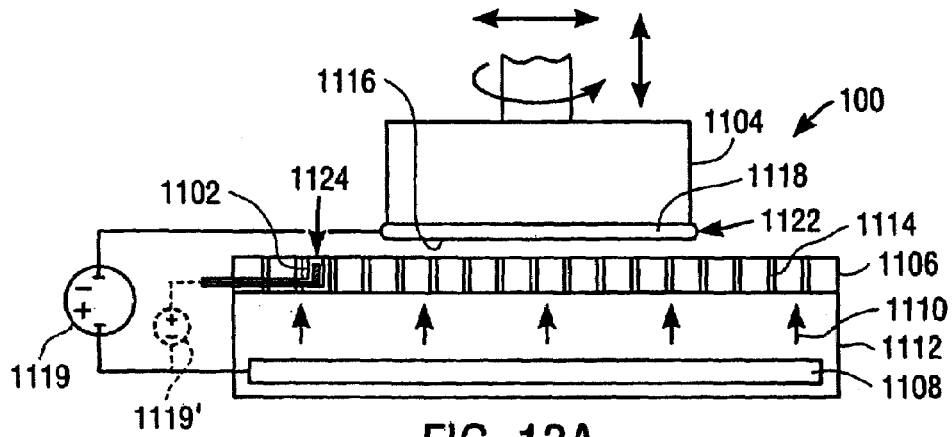
FIGS. 13A–13B illustrate an ECMPR (electrochemical mechanical processing) system including edge bevel conductor removal device (EBCR device) of the present invnetion.
Figure 13B:
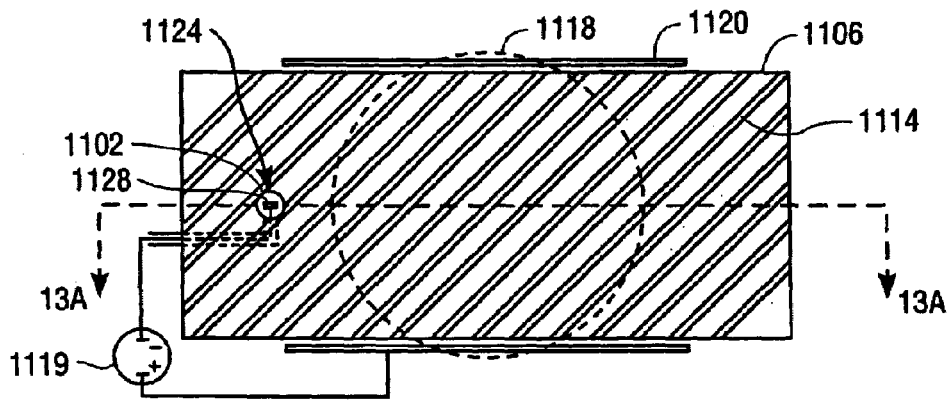

FIGS. 13A–13B illustrate an ECMPR (electrochemical mechanical processing) system 1100 including edge bevel conductor removal device 1102 (EBCR device hereinafter). The ECMPR system of the present invention may be used as an electrochemical mechanical deposition (ECMD) system, an electrochemical mechanical etching (ECME) system, or both. As will be described below, the ECMPR system 1100 is able to perform in-situ edge bevel conductor removal process using the EBCR device 1102 and the same electrolyte or process solution used for the deposition or etching processes carried out in the ECMPR system 1100. It should be appreciated that the EBCR device of the present invention can be used to remove the edge copper from wafers in other, more conventional conductor deposition and removal systems, for example in standard electroplating systems and electropolishing systems.

The ECMPR system 1100 further comprises a number of components such as a carrier head 1104, a workpiece surface influencing device (WSID) 1106, and an electrode 108 immersed in a process solution 1110, which is contained in a process solution container 1112. The ECMPR system 1100 is capable of performing planar or non-planar plating as well as planar or non-planar electroetching. For example, if non-planar process approach is chosen, the front surface of the wafer is brought close to the WSID, but there is a gap between the wafer surface and the surface of the WSID, so that non-planar metal deposition can be performed. Further, if planar process approach is chosen, the front surface or side of the wafer contacts the WSID as a relative motion is established between the WSID and the wafer surface. As the electrolyte solution is delivered through the WSID, the wafer is moved, while the front surface contacts the WSID. Under an applied potential between the wafer and an electrode, and in the presence of the process solution 1110 that flows through the WSID, the conductor such as copper, is plated on or etched off the front surface of the wafer.

The ECMPR system 1100 further comprises a number of components such as a carrier head 1104, a workpiece surface influencing device (WSID) 1106, and an electrode 1108 immersed in a process solution 1110, which is contained in a process solution container 1112. The ECMPR system 1100 is capable of performing planar or non-planar plating as well as planar or non-planar electroetching. For example, if non-planar process approach is chosen, the front surface of the wafer is brought close to the WSID, but there is a gap between the wafer surface and the surface of the WSID, so that non-planar metal deposition can be performed. Further, if planar process approach is chosen, the front surface or side of the wafer contacts the WSID as a relative motion is established between the WSID and the wafer surface. As the electrolyte solution is delivered through the WSID, the wafer is moved, while the front surface contacts the WSID. Under an applied potential between the wafer and an electrode, and in the presence of the process solution 1110 that flows through the WSID, the conductor such as copper, is plated on or etched off the front surface of the wafer.

Figure 14:
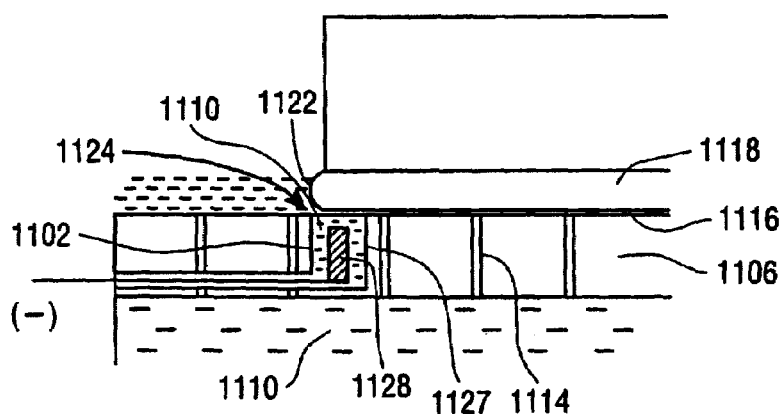
FIG. 14 illustrate the EBCR device placed in the workpiece surface influencing device.

As shown in FIGS. 13A–13B, the EBCR device 1102 of the system is located in the WSID 1106 of the system 1100. In operation, once the process carried out on the wafer is over, the wafer carrier 1104 moves the wafer 1118 towards the EBCR device and positions the edge region 1122 over an upper opening 1124 of the EBCR device 1102. The upper opening 1124 of the EBCR is in the top surface 1126 of the WSID 1106 and thereby allows the electrolyte 1110, which is flowing through the channels 1114, to continuously flow in and out of the EBCR device. Alternately, the electrolyte may directly come from the bottom of the EBCR device. The solution in the EBCR device is part of the electrolyte 110 that is flowing between, and thereby touching the both, WSID and the plated copper on the front side of the wafer 1118. At this stage, the EBCR device 1162 is switched on by establishing a connection between the EBCR device and a negative terminal of the power supply 1119 (See FIG. 13B). The front side 1116 of the wafer 1118 is connected to a positive terminal of the power source through contacts 1120. This way, the edge copper removal may be performed through electroetching of the edge bevel copper at the edge of the wafer As shown in FIG. 14, the EBCR device comprises an enclosure 1127 holding an EBCR electrode 1128. The enclosure 1127 may be an opening in the WSID. The electrolyte 1110 that fills the EBCR device wets the electrode 1128 and the copper at the front side 1116 and the edge region 1122 of the wafer 1118. Therefore, once a voltage is applied between the EBCR electrode 1128 and the copper layer or the surface of the wafer, making the wafer more positive, an electroetching current flows from the edge region 1122 of the wafer (which is anodic) to the EBCR electrode 1128 (which is the cathode). The electroetching current is substantially confined to the volume of the enclosure 1127, therefore the current is rather localized. As the electrolyte 1110 is flowed through the WSID, the edge region is moved over the opening 1124 by rotating the wafer 1118, thereby copper on the edge region 1122 is removed as the edge region 1122 passes over the opening 1124. However, once the edge region is brought over the opening 1124 of the EBCR device 1102, the extent of copper removal from the edge region depends on certain variables such as the distance between the opening and the edge region 1122 and resistance of the process solution.

Figure 15A:
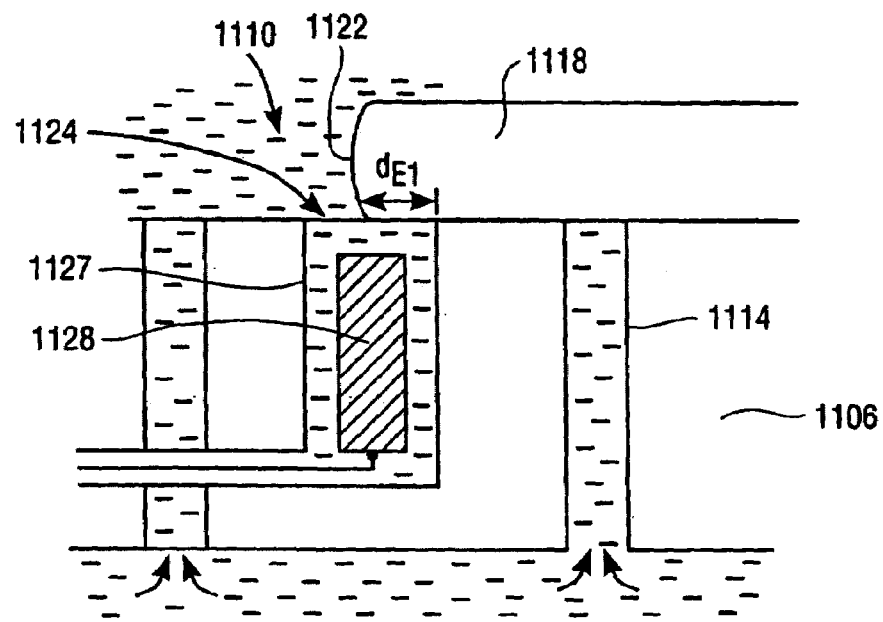
FIG. 15A illustrate an edge region of a wafer that is positioned on the opening of the EBCR device during the edge bevel conductor removal process.

As exemplified in FIG. 15A, if the wafer is brought over the EBCR device 1102 while contacting the WSID 1106, the distance between the edge region or the front side 1116 of the wafer and the surface of the WSID 1106 is minimal or zero. Accordingly, electroetching of the copper at the edge region 1122 progresses along the portion of the edge region that is placed upon the opening 1124. Since the wafer is contacting the WSID 1106, etching does not extend appreciably inwardly on the front side. The distance $d_{E1}$ shows approximately the extent of the copper that is removed by the EBCR device while the wafer is contacting the WSID 1106.

Figure 15B:
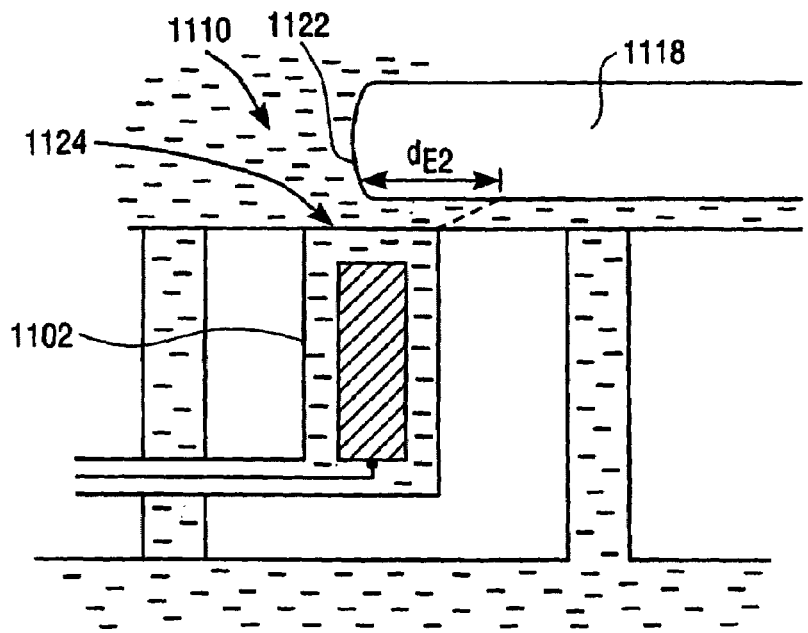
FIG. 15B illustrate an edge region of a wafer that is positioned above the opening of the EBCR device during the edge bevel conductor removal process.

However as shown in FIG. 15B, if the wafer is in non-contact position, the effect of EBCR device may extend further inwardly and the extent of removal from the edge may get larger. If the distance that is etched is depicted with the distance $d_{E2}$ ($d_{E2} > d_{E1}$), then the distance $d_{E2}$ grows as the vertical distance between the wafer and the WSID is increased. This is due to the fact that a larger area around the wafer is exposed to the current from the EBCR device. However, if the process solution used in the ECMPR system is a high resistivity solution, such as solutions with low acidity but high copper concentration, the extent of etching maybe limited substantially to the area across the opening 1124 of the EBCR device 1102.

In general, completion of the EBCR process may be detected by monitoring the electroetching voltage and current. Referring to FIGS. 15A and 15B, as copper is removed from the edge region 1122 of the wafer, if an electrical contact is made to copper layer (such as through contacts 1120 shown in FIG. 13B), voltage will increase for a given current and current will decrease for a given voltage, indicating removal of copper from the edge.

Figure 16A:
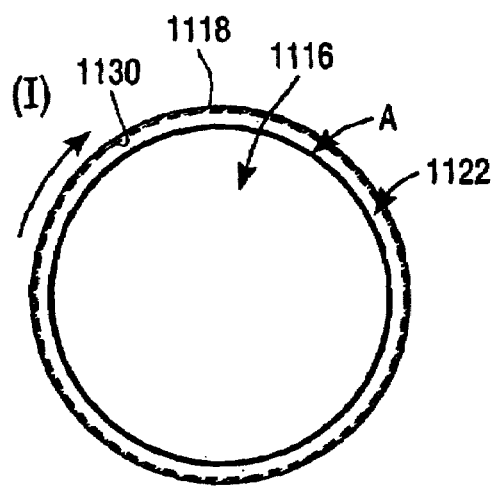
FIGS. 16A–16C illustrate stages of the edge bevel conductor removal process.
Figure 16B:
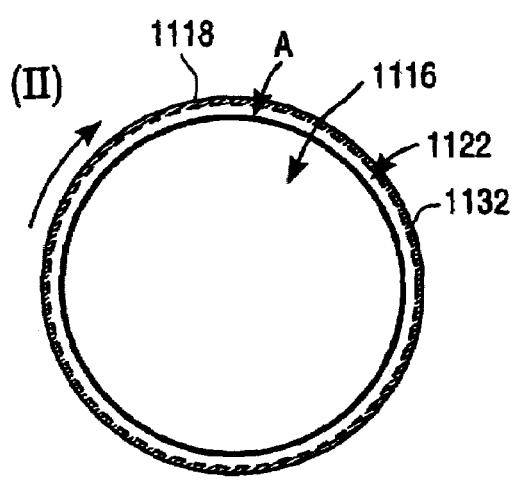
Figure 16C:
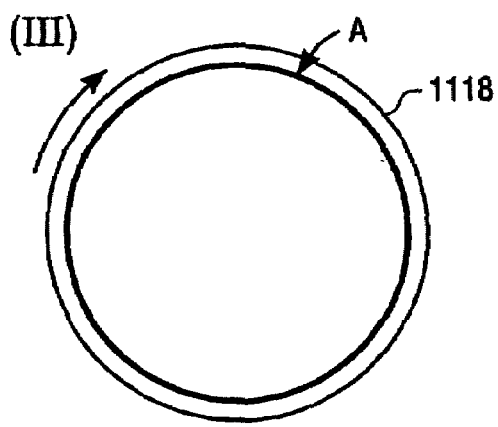
Figure 17:
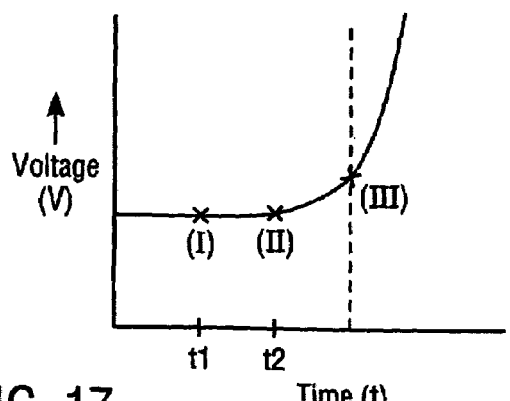
FIG. 17 is a graph showing changes in EBCR process voltage with respect to time.

FIGS. 16A–16C in connection with FIG. 17 exemplifies an EBCR endpoint detection process using an electrical contact, such as the one used in FIG. 13B, for the wafer 1118. Stages (I), (II) and (III) shown in FIGS. 16A–16C illustrate the copper plated front surface 1116 of the wafer as the EBCR process progresses, using the EBCR device described in connection with FIGS. 15A–15B, in certain exemplary time intervals. FIG. 17 shows changes in EBCR process voltage with respect to time. Stage (I) of FIG. 16A shows the extent of copper removal at a first time period. As the wafer 1118 is rotated, position of the electrical contact is represented with path A on the edge region 1122. Upon application of voltage for a first exemplary time period $t_1$ (FIG. 17), the copper at the very perimeter is removed until a first removal line 1130 thereby exposing the underlying barrier layer. Further, in stage (II) of FIG. 16B, in a second exemplary time period $t_2$, the copper layer is removed until a second removal line 1132. Referring to FIG. 17, during $t_1$ and $t_2$ exemplary time periods, the voltage stays relatively unchanged, which indicates that there is still copper to be removed from the edge region. Referring to FIG. 16C, in stage (III), in a third time period, copper is removed until path A or the end point, completing the EBCR process. As shown in FIG. 17, as the copper removal gets closer to the path A of the electrical contact voltage increases, indicating the removal of the edge copper along the contact path A. As the copper along the contact path A is removed, the electrical contact touches the barrier layer which is less conductive than copper. This results in increase in the voltage. Upon detection of increase in the voltage, EBCR process is halted.

Figure 18:
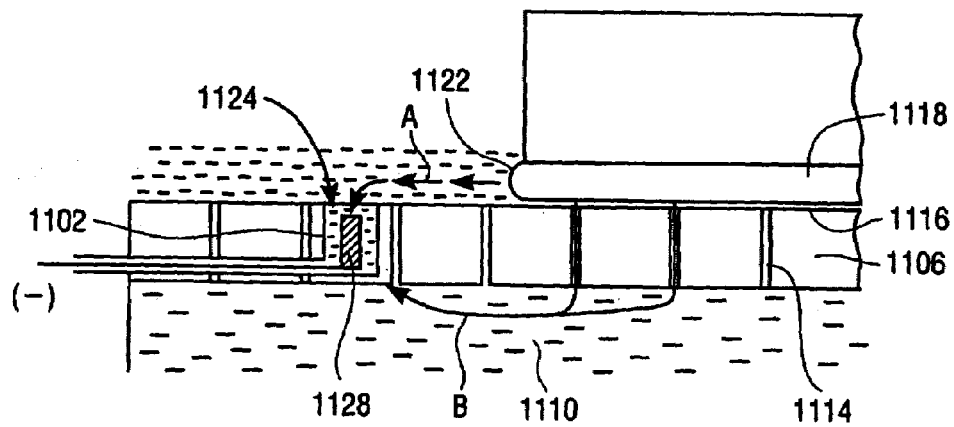
FIG. 18 illustrate an alternative EBCR process performed while the edge of the wafer is kept away from the EBCR device.

As illustrated in FIG. 18, differing from the above approach, the wafer is kept away from the EBCR device 1102 while contacting or being in close proximity of the surface of the WSID 1106 during the EBCR process. In this approach, since the distance between the edge region 1122 and the EBCR electrode 1128 is the shortest, when the power is applied electroetching begins at the edge region and, as a function of time, extend inwardly towards the center of the rotating wafer. During the EBCR process, current flow occurs substantially through the electrolyte 1110 that flows over the WSID. Direction of the current flow is depicted by the arrows A. Further, as depicted by the arrows B, a leakage current may follow another route through the holes 1114 of the WSID. Such leakage will cause etching of copper from the wafer surface in areas other than the edge region 1122. Therefore, this leakage current needs to be minimized by decreasing resistance to current flow through path A and increasing resistance through path B. It should be noted that the EBCR approaches described here remove all unwanted Cu from all of the edge region of the wafer including the front side edge region, the back side edge region and the bevel. The reason is the process solution is in physical contact with all these regions and the electro-etching current has access to all of them during EBCR.

After repeating the EBCR process a plurality of times, or after each EBCR process, the EBCR electrode 1128 is expected to have some copper accumulated on it. The copper accumulated on the EBCR electrode 1128 may be cleaned by applying a potential between the EBCR electode 1128 and another electrode touching the solution, such as the electrode 1108. Referring back to FIG. 13A, during the cleaning the EBCR electrode 1128 is connected to a positive terminal of a power supply 1119' (shown in dotted lines) while the electrode 1108 is connected to a negative terminal of the power supply 1119' until the accumulated copper on the electrode 1128 is electroetched. It is understood that although the EBCR process is performed using the power supply 1119 and cleaning of the EBCR electrode is done using the power supply 1119' in the present example, the power supply 1119 can alone be used to supply power for all the processes performed in the ECMPR system 1100 with appropriate electrical connections and switches as will be described later. Further, the EBCR electrode cleaning step may take place during a time period when the wafer is being cleaned through a rinse process after the EBCR process. This way, the EBCR electrode cleaning time does not impact the overall throughput of the ECMPR process.

Figure 19A:
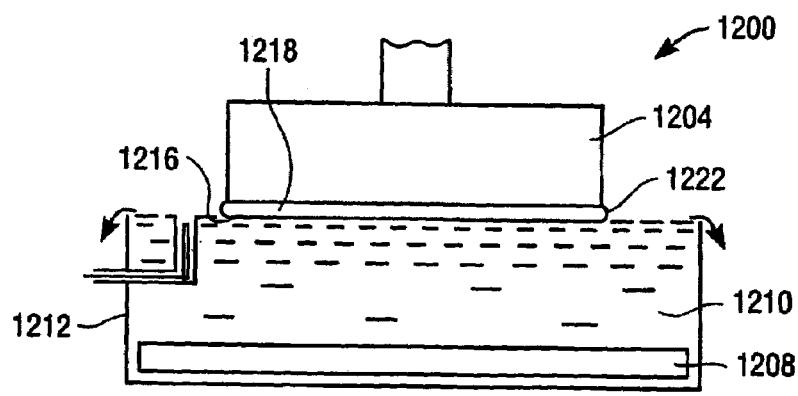
FIGS. 19A–19B illustrate an electrochemical deposition system having an EBCR device.
Figure 19B:
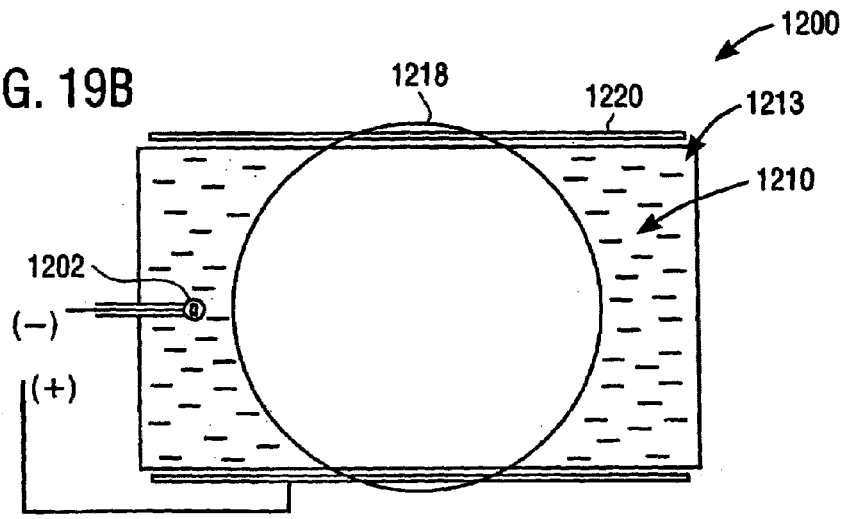

FIGS. 19A–19B illustrate an ECD (electrochemical deposition) system 1200 including edge bevel removal device 1202 (EBCR device hereinafter). The system 1200 is able to perform full face electrodeposition and in-situ edge bevel removal process using the EBCR device in conjunction with the same electrolyte solution used in the system for deposition. The system 1200 comprises a number of system components such as a carrier head 1204, an electrode 1208 immersed in a process solution 1210 which is contained in a process solution container 1212. The container 1212 may be a rectangular enclosure with an upper opening 1213. The container 1212 is kept full with the electrolyte up to the level of upper opening 1213 and the electrolyte is continuously flowed out from the opening 1213. If the wafer is brought to the proximity of the upper opening 1213, the out flowing electrolyte wets a front side 1216 of a wafer 1218 that is held by the carrier head 1204. The carrier head is able to rotate and move the wafer laterally and vertically over the opening 1213 while exposing the front side 1216 of the wafer to the electrolyte. Prior to the EBCR process, under an applied potential between the wafer and the electrode, the front side 1216 of the wafer 1218 is plated with a conductor layer such as a copper layer. The electrode (anode) is connected to a positive terminal of a power source (not shown) during this process. The front side 1216 of the wafer is connected to a negative terminal of the power source through contacts which may be contacts 1220 extending along the container 1212 as shown in FIG. 19B. It should be noted that contacts 1220 may be different shapes and forms including curved (following the circumference of the wafer). Present example uses linear contacts that are stationary.

As in the case above, during the plating, copper is also plated on an edge region 1222 of the wafer. This is an unwanted situation and copper plated on the edge region should be removed with an EBCR process step of the present embodiment. Referring to FIGS. 19A–19B, the EBCR device 1202 of the system is immersed in the process solution 1210. In operation, once the ECD process is over, the wafer carrier 1204 may laterally move the wafer 1218 towards the EBCR device 1202 and positions the edge region 1222 over the EBCR device 1202. Alternately, the EBCR device may be moved towards the edge region. EBCR device may be kept out of the process solution during copper deposition. It may be dipped into the process solution while performing EBCR.

Figure 20:
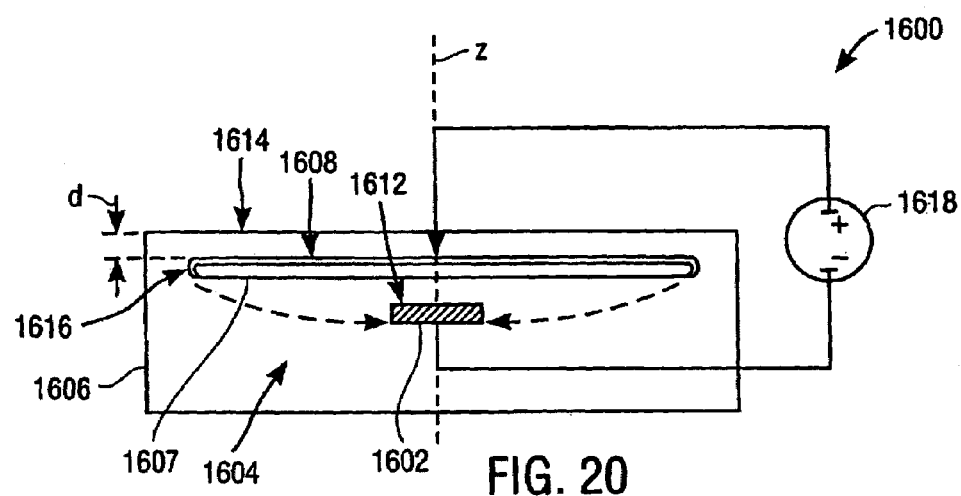
FIG. 20 illustrates an EBCR system including an etching electrode.

Also with an appropriate wafer carrier design, which allows process solution to wet the back of the wafer, an electrode may be placed onto the back side of the wafer and the EBCR process may be performed to remove copper on the edge region. FIG. 20 illustrates an EBCR system 1600 including an electrode 1602 immersed in a process solution 1604 which is contained in a process solution container 1606. Back side 1607 of a work piece 1608 such as a semiconductor wafer, having a copper plated front surface 1610, is positioned across the electrode 1602. The center of the electrode 1602 (assuming that it is round) and the center of the wafer 1608 are preferably nearly aligned along a z-axis.

A wafer carrier (not shown) may keep the wafer closer to process solution surface 1614. In order to avoid etching beyond an edge area 1616 of the wafer, the front surface 1610 of the wafer is kept close to the process solution surface 1614 so that a d distance between the process solution surface 1614 and the front surface 1610 of the wafer 1608 is preferably less than an amount that introduce a solution electrical resistance which is much larger than the resistance of the copper film on the substrate. The distance d may be a few millimeters. During the EBCR process, the front surface 1608 of the wafer is connected to a positive terminal of a power supply 1618 while the electrode 1602 is connected to a negative terminal of the power supply 1618. When the power is applied, electroetching begins at the edge region 1616 and, as a function of time, extend inwardly towards the center of the front surface 1610. Higher electrical resistivity of the narrow solution body on the front surface 1610 limits the extent of electroetching on the front surface 1608. The extent of electroetching on the front surface may be increased by increasing the d distance. It should be noted that the solution used in this approach should be one that does not appreciably chemically etch the film surface 1608. However, it should have the ability to electrochemically etch the film when a voltage is applied. The chemical etching rate of the solution may be less than 1100 A/min. Such mild chemical etching solutions perform well in this invention as electroetching solutions while they mildly chemically etch and clean the surface as EBCR process is carried out. The electrical contact to the wafer surface is shown in the middle of the wafer in FIG. 20. Preferably this contact may be anywhere near or at the edge of the wafer so that when the edge is cleared of the copper film the current and voltage signals from the electroetching process indicate completion of the process as described before. In that respect the contact may be placed on the front edge of the wafer at a position which is equal or close to the edge exclusion value desired on the wafer after EBCR. Once Cu removal starts, any Cu in the back of the wafer is removed. Then Cu on the bevel is cleared. The removal then continues towards the center of the wafer on the upper surface 1608. When the edge exclusion is reached where electrical contact is, the voltage goes up indicating end point, at which time process is stopped by terminating electroetching.

Figure 21A:
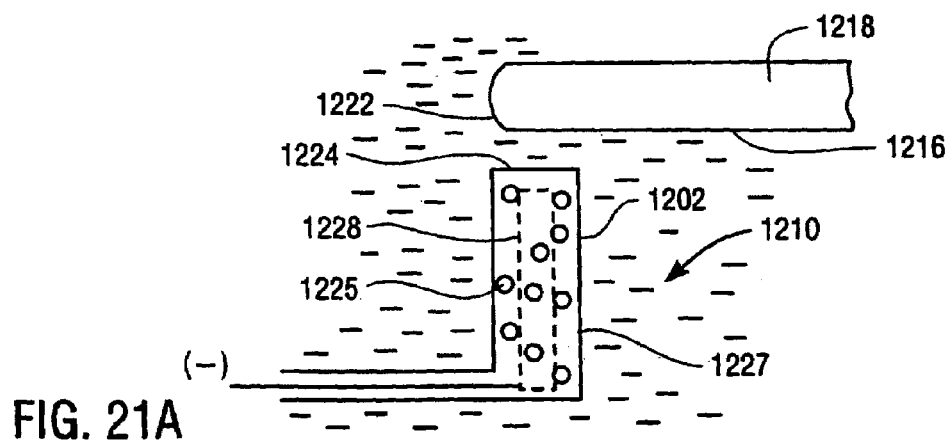
FIGS. 21A–21B illustrate various embodiments of EBCR devices.

FIG. 21A depicts in detail the EBCR device 1202, shown in FIGS. 15A and 15B, comprising an enclosure 1227 holding an EBCR electrode 1228. The EBCR device 1202 allows process solution 1210 to flow into the EBCR device through an opening 1224 at the top of the device and optionally through a number of openings or holes 1225 around the device. At this stage, the EBCR device 1202 is switched on by establishing a connection between the EBCR device and a negative terminal of the power supply. Copper on the front side of the wafer is connected to a positive terminal of the power source. The process solution 1210 that fills the EBCR device puts the EBCR electrode 1228 of the EBCR device, which is connected to the negative terminal of the power source, in electrical contact with the copper at the front side 1216 and the edge region 1222 of the wafer 1218 through the process solution. As the process solution 1210 flows, the edge region 1222 is moved over the opening 1224 by rotating the wafer 1218, thereby copper on the edge region 1222 is electrochemically removed as the edge region passes over the opening 1224.

As mentioned before, the extent of copper removal from the edge region 1122 depends on the distance between the edge region and the opening 1224 of the EBCR device 1202. As the vertical distance between the opening and the edge region 1122 of the wafer is increased, the extent of copper removal is also increased. However as previously explained, this is also limited with the resistivity of the process solution.

In an approach similar to the one described in connection with FIGS. 19A–19B and FIG. 20, EBCR process may be initiated without moving the wafer 1218 after all. However, the EBCR device may be brought closer to the surface of the electrolyte 1110. In this approach, the process solution 1210 is applied to the surface 1216 and edge region 1222 of the wafer 1218. When the power is applied, electroetching begins at the edge region and, as a function of time, extend inwardly towards the center of the rotating wafer. In this particular approach, a relatively small electrode may replace the EBCR device.

As described in the previous embodiment, the copper, which is accumulated on the EBCR electrode 1228, may be cleaned by applying a proper potential between the EBCR electrode 1228 and the electrode 1208 after the EBCR process is complete. Alternately, another electrode (not shown) in contact with the solution may be used to transfer the accumulated copper on. This other electrode may then be cleaned at intervals by taking it out and etching it in an etching solution.

Figure 21B:
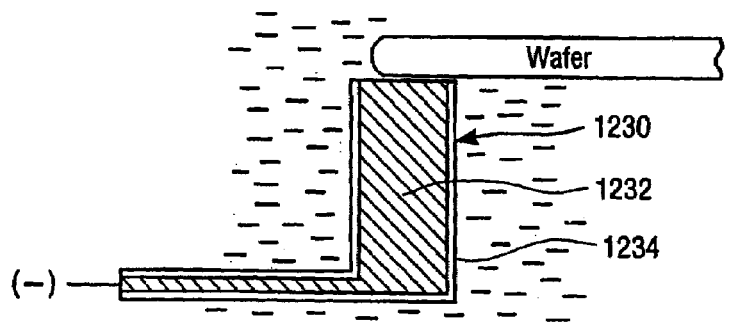

As shown in FIG. 21B, in another embodiment, an EBCR device 1230 of the present invention. In this embodiment the device 1230 is comprised of a solid body having an inner conductive core 1232 and an outer insulating sheath 1234. The EBCR device 1230 of the present embodiment is utilized as described in the previous embodiment for the device 1202.

Figure 22A:
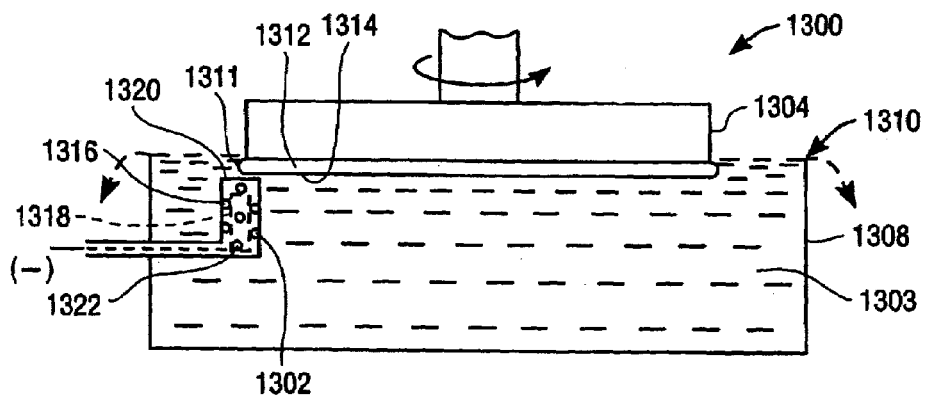
FIGS. 22A–22B illustrate an EBCR system having an EBCR device.
Figure 22B:
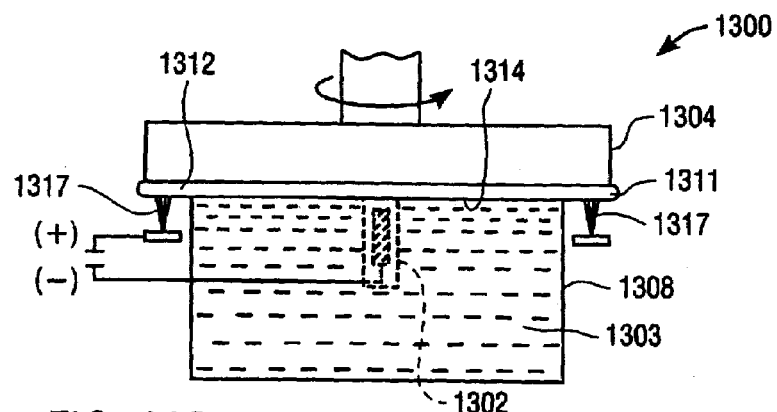

FIGS. 22A–22B illustrate an EBCR system 1300 including EBCR device 1302. The system 1300 is able to perform edge bevel removal process using the EBCR device with an EBCR solution 1303. Wafers to be processed in this system may be preprocessed wafers that are copper plated using any of the known deposition methods including ECMD, ECD, CVD, MOCVD and PVD etc.

The system 1300 comprises a carrier head 1304, an EBCR solution 1306 which is contained in a container 1308. The container 1308 may be a rectangular enclosure with an upper opening 1310. FIG. 22A shows the container 1308 along its longer side view. The container 1308 is kept full with the solution up to the level of upper opening 1310 and the solution is continuously flowed out from the opening 1310. During the process, a wafer 1312 held by the carrier head 1304 is brought to the proximity of the upper opening 1310 and an edge region 1311 is placed over the EBCR device 1302 that is immersed in the EBCR solution 1303. The EBCR device 1302 comprises an enclosure 1316 holding an electrode 1318. The EBCR device 1302 allows process solution 1303 to flow into the EBCR device through an opening 1320 at the top of the device and optionally through a number of holes 1322 around the device. The carrier head is able to rotate over the opening 1310 while fully exposing the front side 1314 of the wafer to the weak solution 1303. The weak solution does not etch the copper on the front side 1314 of the wafer.

FIG. 22B shows the container along its shorter side view. As shown in FIG. 22B, the front side 3114 of the wafer is connected to a positive terminal of the power source through contacts 1317 extending along the container 1308. At this stage, the EBCR device 1302 is switched on by establishing a connection between the EBCR device and a negative terminal of the power supply. The solution 1303 that fills the EBCR device puts the electrode 1318 of the EBCR device, which is connected to the negative terminal of the power source, in contact with the copper at the front side 1314 and the edge region 1311 of the wafer 1312. As the solution is flown, the edge region 1311 is moved over the opening 1320 of the EBCR device 1302 by rotating the wafer 1312, thereby copper on the edge region 1311 is removed as the edge region passes over the opening 1320.

As in the previous cases the extent of copper removal from the edge region 1311 depends on the distance between the edge region and the opening 1320 of the EBCR device 1302. As the vertical distance between the opening and the edge region 1311 of the wafer is increased, the extent of copper removal is also increased. However as previously explained, this is also limited with the resistivity of the process solution.

Figure 23A:
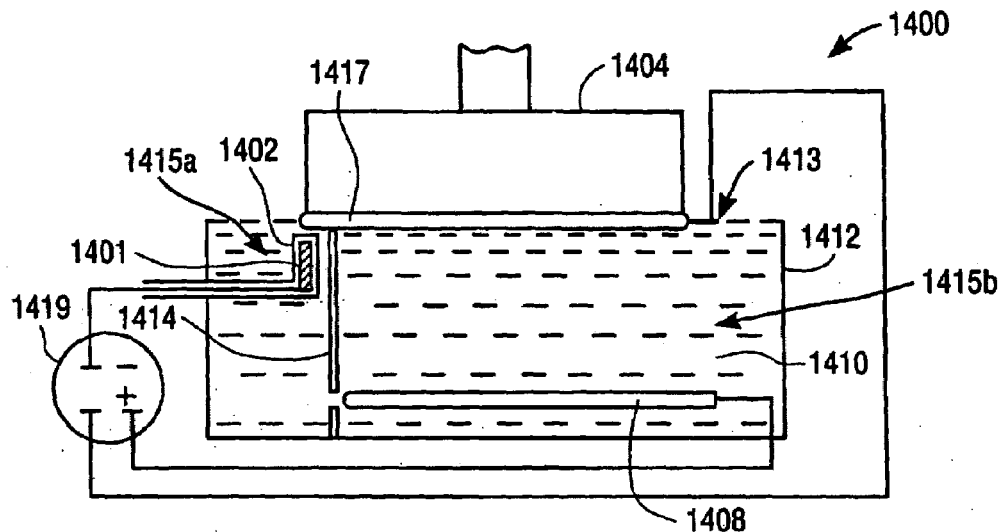
FIGS. 23A–23B illustrate a system having electrochemical deposition and EBCR sections.
Figure 23B:
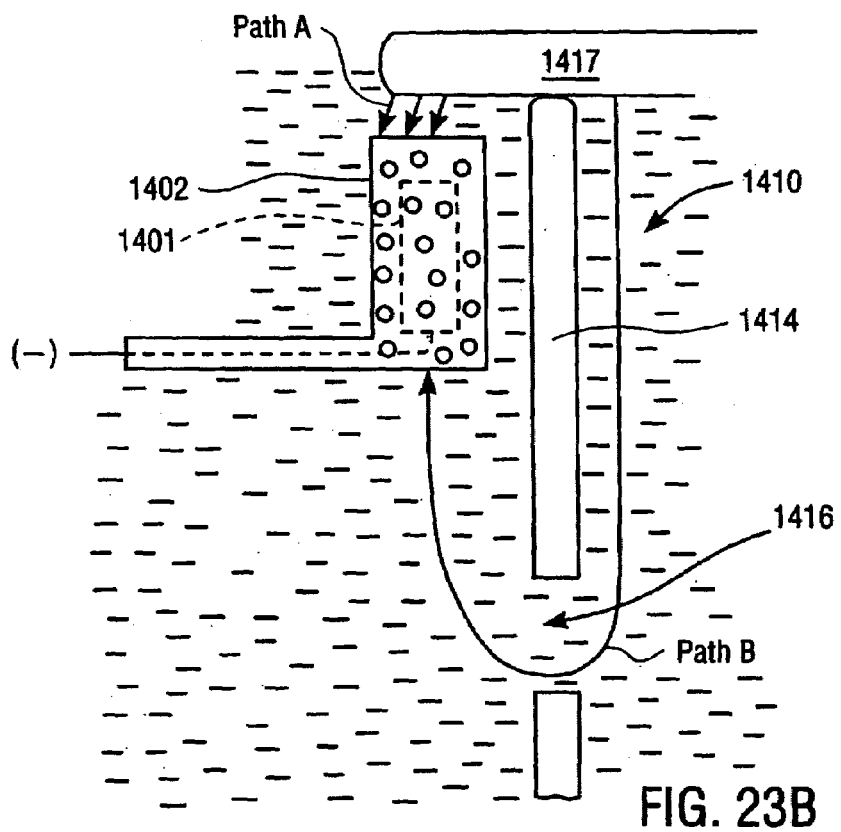

FIGS. 23A–23B illustrate an ECD (electrochemical deposition system) 1400 including edge bevel removal device 1402 (EBCR device hereinafter) having an electrode 1401. The system 1400 is able to perform in-situ edge bevel removal process using the EBCR device in conjunction with the same electrolyte solution used in the system for deposition.

The system 1400 comprises a number of system components such as a carrier head 1404, an electrode 1408 immersed in a process solution 1410 which is contained in a process solution container 1412. The container 1412 may be a rectangular enclosure with an upper opening 1413. A wall 1414 separates a first section 1415a of the container from a second section 1415b. In this embodiment the first section 1415a is an EBCR section where the EBCR device 1402 is kept and the EBCR process is performed. The second section 1415b is an ECD section. The EBCR and ECD sections 1415a, 1415b may be connected through an opening 1416 in the wall 1414. This adds another fluid communication opening between the sections 1415a and 1415b in addition to fluid communication at the top. The container 1412 is kept full with the electrolyte up to the level of upper opening 1413 and the electrolyte is continuously flowed out from the opening 1413. When a wafer 1417 is brought to the proximity of the upper opening 1413 at the ECD section 1415b, the out flowing electrolyte wets a front side 1418 of the wafer 1417 that is held by the carrier head 1404. The carrier head is able to rotate and move the wafer laterally and vertically over the opening 1413 while fully exposing the front side 1418 of the wafer to the electrolyte. In The ECD section 1415b, prior to the EBCR process, the front side 1418 of the wafer 1416 is plated with a conductor layer, preferably, a copper layer, under an applied potential between the wafer and the electrode. The electrode (anode) is connected to a positive terminal of the power source (not shown). The front side 1418 of the wafer is connected to a negative terminal of a power source 1419 through contacts (not shown) extending along the container 1412.

As shown in FIGS. 23A–23B, copper plated on an edge region 1422 is removed in the EBCR section 1415*a* of the system 1400 by laterally moving the wafer 1416 over the EBCR section 1415*a* and positioning the edge region 1422 over or in close proximity of the EBCR device 1402. Once electrode 1401 is connected to a negative terminal of the power source 1419 current flow preferentially follows 'path A' rather than 'path B' through the hole 1416 because resistance to current flow through 'path B' is higher. In this embodiment, the EBCR process is performed as in the previous embodiments. This design may also be used in a separate EBCR system using an EBCR electrolyte.

Figure 24:
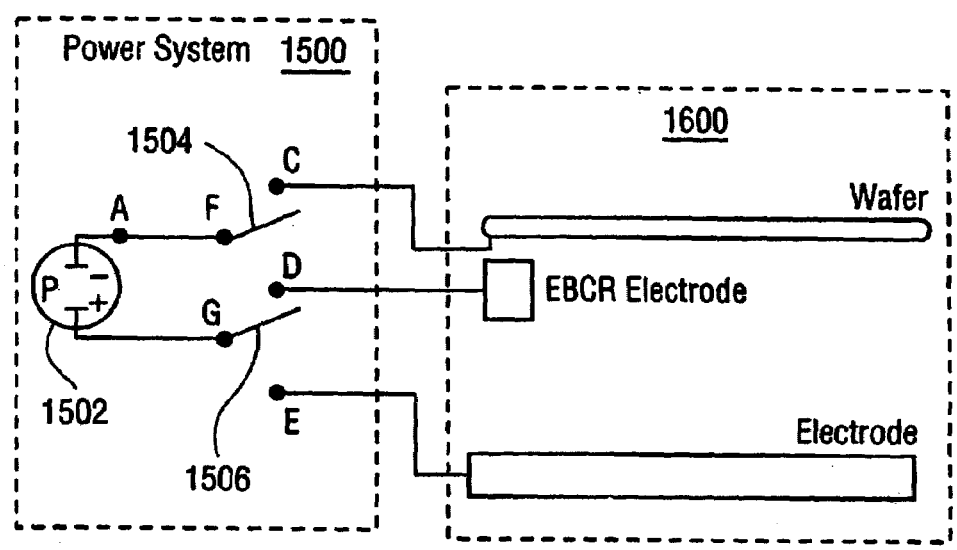
FIG. 24 illustrate a power switching system which can be used for an EBCR process in an electroplating or electroetching system.

FIG. 24 exemplifies a possible schematic of a power switching system 1500 used for both the EBCR process and any of the plating or electroetching processes such as ECMPR, ECD or ECMD. The power switching system 1500 may comprise a power supply 1502. Through a first switch 1504 and a second switch 1506, the power supply 1502 is connected to an electro-treatment system 1600 which may be an ECMPR or ECD system. For the purpose of clarity, FIG. 24 schematically shows a wafer1 1602, an EBCR electrode 1604 and an electrode 1606 of the system 1600. The following table shows types of processes that can be performed in the system 1600 as the polarity of node A as well as positions of the switches 1504 and 1506 in the system 1500 are changed.

| A | Position of the first switch 1504 | Position of the second switch 1506 | Process |
|---|---|---|---|
| (−) | FC | GE | Electroplating on wafer |
| (+) | FC | GE | Electroetching from wafer |
| (+) | FC | GD | EBCR from wafer |
| (+) | FD | GE | EBCR electrode cleaning |

Although some examples described above used a plating solution as the process solution to demonstrate the capability of the methods of the invention to achieve in-situ edge conductor removal right after conductor deposition, it should be understood that the systems described may be electroetching systems and the process solution may be an electroetching solution such as phosphoric acid solution for the case of copper removal. In this case electroetching process is performed to remove the copper from the surface of the workpiece and then in-situ removal of the edge copper is carried out using the EBCR devices of the present inventions. Alternately, the above mentioned systems with EBCR devices may be used to remove the edge copper films of workpieces that are previously processed in other modules. For example, these systems may be used to remove edge copper from wafers that have been polished by CMP, etching or electroetching techniques to remove the excess conductor from their whole surface, except at the edge.

Although various preferred embodiments have been described in detail above, those skilled in the art will readily appreciate that many modifications of the exemplary embodiment are possible without materially departing from the novel teachings and advantages of this invention.

What is claimed is:

1. A method of removing a conductive material from a bevel edge of a conductive layer of a workpiece, including a front edge surface of the conductive layer, using a process solution and an etching electrode in contact with the process solution comprising:
   processing a top surface of the conductive layer in the process solution;
   establishing a proximity between the etching electrode and the bevel edge in the process solution by moving at least one of the etching electrode and the workpiece after processing;
   rotating the workpiece after establishing the proximity; and
   applying a potential difference between the etching electrode and the bevel edge of the conductive layer of the workpiece in the process solution while rotating the workpiece.

2. The method according to claim 1, wherein the process solution is a plating solution.

3. The method according to claim 2, wherein processing is depositing the conductive material on the top surface of the conductive layer from the process solution.

4. The method according to claim 3, wherein depositing uses an electrochemical mechanical deposition process.

5. The method according to claim 3, wherein depositing and establishing take place in a single chamber.

6. The method according to claim 3, wherein depositing and establishing take place in adjacent chambers that are separated with a wall allowing fluid flow.

7. The method according claim 1, wherein conductive material is removed from the bevel edge of the conductive layer of the workpiece while applying the potential difference.

8. The method according to claim 1, further including cleaning the etching electrode after applying the potential difference.

9. The method according to claim 8, wherein cleaning includes applying a potential difference between the etching electrode and a processing electrode.

10. The method according to claim 9, wherein applying a potential difference between the etching electrode and the processing electrode includes making the etching electrode anodic compared to the processing electrode.

11. The method according to claim 1, wherein establishing proximity comprises positioning the bevel edge over the etching electrode.

12. The method according to claim 1, wherein applying the potential difference includes making the conductive layer anodic compared to the etching electrode.

13. An apparatus for processing a conductive surface of a workpiece and removing conductive material from an edge bevel of the conductive surface using a process solution, comprising:
   a process electrode immersed in the process solution configured to process a conductive front surface of the workpiece;
   a workpiece holder configured to hold and move the workpiece; and
   an edge bevel removal electrode immersed in the process solution; and
   a power supply configured to establish a potential difference between the edge bevel removal electrode and the conductive layer so that when the edge bevel is close to the etching electrode, the conductive material from the edge bevel is removed.

14. The apparatus according to claim 13, further including an electrochemical mechanical processing system disposed within the chamber configured for providing electrochemical mechanical processing on the front surface of the workpiece.

15. The apparatus of claim 14, wherein the edge bevel removal electrode is disposed in a polishing pad.

16. The apparatus of claim 13, wherein the edge bevel removal electrode is in an enclosure having at least one opening.

17. The apparatus according to claim 13, wherein the processing electrode is connected to the power supply so that a potential difference is applied between the processing electrode and the conductive front surface during processing of the conductive front surface.

18. The apparatus according to claim 13, wherein the edge bevel removal electrode is placed in a first section of a chamber, the first section being separated from a second section holding the process electrode by a wall having openings.

19. A method of plating and performing edge bevel removal on a workpiece using a solution in a chamber, comprising:
    processing a conductive layer on a front surface of the workpiece in the solution while applying a potential difference between a process electrode and the front surface of the workpiece;
    moving an edge bevel of the workpiece near an etching electrode after processing, wherein the etching electrode is in the solution;
    rotating the workpiece; and
    applying a potential difference between the etching electrode and the conductive layer of the workpiece in the process solution to remove conductive material from the edge bevel while rotating the workpiece.

20. The method according to claim 19, wherein the solution is a plating solution.

21. The method according to claim 19, wherein conductive material from the bevel edge is removed during application of the potential difference.

22. The method according to claim 19, further including cleaning the etching electrode after applying the potential difference.

23. The method according to claim 19, wherein cleaning includes applying a potential difference between the etching electrode and the process electrode.

24. The method according to claim 19, wherein applying the potential difference includes making the conductive layer anodic compared to the etching electrode.

25. A method of removing a conductive material from an edge region of a conductive surface of a workpiece using a process solution and an electrode in contact with the process solution, comprising:
    processing a front surface of the workpiece using the process solution;
    rotating the workpiece;
    contacting the edge region of the conductive surface of the workpiece with the process solution while rotating;
    positioning the edge region of the workpiece adjacent to the electrode while contacting and rotating; and
    after positioning, applying a potential difference between the electrode and the conductive surface of the workpiece while contacting and rotating.

26. The method according to claim 25, wherein the process solution is a plating solution.

27. The method according to claim 26, wherein the plating solution etches the edge region as a result of the applying of the potential difference.

28. The method according to claim 26, wherein processing comprises depositing a conductor on the conductive surface of the workpiece using the plating solution.

29. The method according to claim 28, wherein depositing, positioning and applying all take place with the workpiece disposed in a single chamber.

30. The method according to claim 29, wherein depositing uses an electrochemical mechanical deposition process.

31. The method according to claim 30, wherein depositing takes place with the workpiece disposed on a workpiece surface influencing device, and positioning and applying take place with the edge region of the workpiece disposed over an opening, in the workpiece surface influencing device, that retains the electrode.

32. The method according to claim 30, wherein depositing takes place with the workpiece disposed on a workpiece surface influencing device, and positioning and applying take place with the edge region of the workpiece disposed adjacent to an opening, in the workpiece surface influencing device, that retains the electrode.

33. The method according to claim 29, wherein depositing uses an electrochemical deposition process.

34. The method according to claim 33, wherein depositing takes place with the conductive surface of the workpiece immersed in a plating solution, and positioning and applying take place with the edge region of the workpiece adjacent to the electrode.

35. An apparatus for performing an edge bevel removal process on a front conductive surface edge of a workpiece comprising:
    a chamber containing a process solution and a process electrode configured to process a front surface of the workpiece in the process solution;
    a moveable and rotatable workpiece holder configured to hold and rotate the workpiece in the process solution; and
    an edge bevel removal structure including an etching electrode adapted to physically contact the process solution and to supply a potential difference with respect to the front conductive surface edge of the workpiece as the front conductive surface edge of the workpiece is disposed near the edge bevel removal structure.

36. The apparatus according to claim 35, further including an electrical contact that provides electrical contact to the conductive surface of the workpiece during edge conductor removal.

* * * * *